(12) United States Patent
Lin et al.

(10) Patent No.: US 10,170,367 B2
(45) Date of Patent: Jan. 1, 2019

(54) SEMICONDUCTOR DEVICE AND METHOD

(71) Applicant: Taiwan Semiconductor Manufacturing Company, Ltd., Hsinchu (TW)

(72) Inventors: Yu Chao Lin, Hsinchu (TW); Chao-Cheng Chen, Hsinchu (TW); Hao-Ming Lien, Hsinchu (TW); Wei-Che Hsieh, New Taipei (TW); Chun-Hung Lee, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/725,805

(22) Filed: Oct. 5, 2017

(65) Prior Publication Data
US 2018/0151441 A1    May 31, 2018

Related U.S. Application Data
(60) Provisional application No. 62/427,748, filed on Nov. 29, 2016.

(51) Int. Cl.
| | | |
|---|---|---|
| H01L 21/306 | (2006.01) | |
| H01L 21/311 | (2006.01) | |
| H01L 21/308 | (2006.01) | |
| H01L 29/66 | (2006.01) | |
| H01L 27/12 | (2006.01) | |
| H01L 27/088 | (2006.01) | |
| H01L 21/8234 | (2006.01) | |
| H01L 29/78 | (2006.01) | |

(52) U.S. Cl.
CPC .. H01L 21/823431 (2013.01); H01L 21/3086 (2013.01); H01L 21/3088 (2013.01); H01L 29/6656 (2013.01); H01L 29/66545 (2013.01); H01L 29/785 (2013.01)

(58) Field of Classification Search
CPC ........... H01L 21/31144; H01L 21/0337; H01L 21/31116; H01L 21/31122; H01L 21/31138; H01L 21/32137; H01J 37/32082
See application file for complete search history.

(56) References Cited

U.S. PATENT DOCUMENTS

| | | |
|---|---|---|
| 8,728,332 B2 | 5/2014 | Lin et al. |
| 8,796,666 B1 | 8/2014 | Huang et al. |
| 8,822,243 B2 | 9/2014 | Yan et al. |
| 8,987,142 B2 | 3/2015 | Lee et al. |
| 9,053,279 B2 | 6/2015 | Chang et al. |
| 9,093,530 B2 | 7/2015 | Huang et al. |
| 9,099,530 B2 | 8/2015 | Lin et al. |
| 9,153,478 B2 | 10/2015 | Liu et al. |
| 9,501,601 B2 | 11/2016 | Chang et al. |

(Continued)

*Primary Examiner* — Brian Turner
(74) *Attorney, Agent, or Firm* — Slater Matsil, LLP

(57) ABSTRACT

In an embodiment, a method includes: patterning a plurality of mandrels over a mask layer; forming an etch coating layer on top surfaces of the mask layer and the mandrels; depositing a dielectric layer over the mask layer and the mandrels, a first thickness of the dielectric layer along sidewalls of the mandrels being greater than a second thickness of the dielectric layer along the etch coating layer; removing horizontal portions of the dielectric layer; and patterning the mask layer using remaining vertical portions of the dielectric layer as an etching mask.

20 Claims, 37 Drawing Sheets

(56) References Cited

U.S. PATENT DOCUMENTS

| | | |
|---|---|---|
| 9,548,303 B2 | 1/2017 | Lee et al. |
| 2014/0001575 A1* | 1/2014 | Adams .................. H01L 21/845 257/412 |
| 2015/0024597 A1* | 1/2015 | Gao .................... H01L 21/3086 438/694 |
| 2016/0126241 A1* | 5/2016 | Ellinger .............. H01L 27/0883 257/43 |
| 2016/0260741 A1* | 9/2016 | Liu ....................... H01L 29/785 |
| 2017/0148789 A1* | 5/2017 | Ok .................... H01L 21/82346 |

* cited by examiner

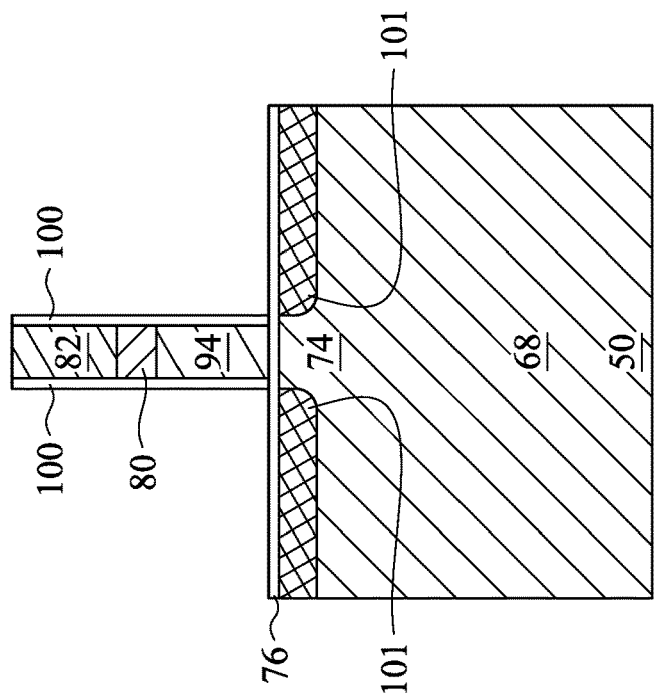
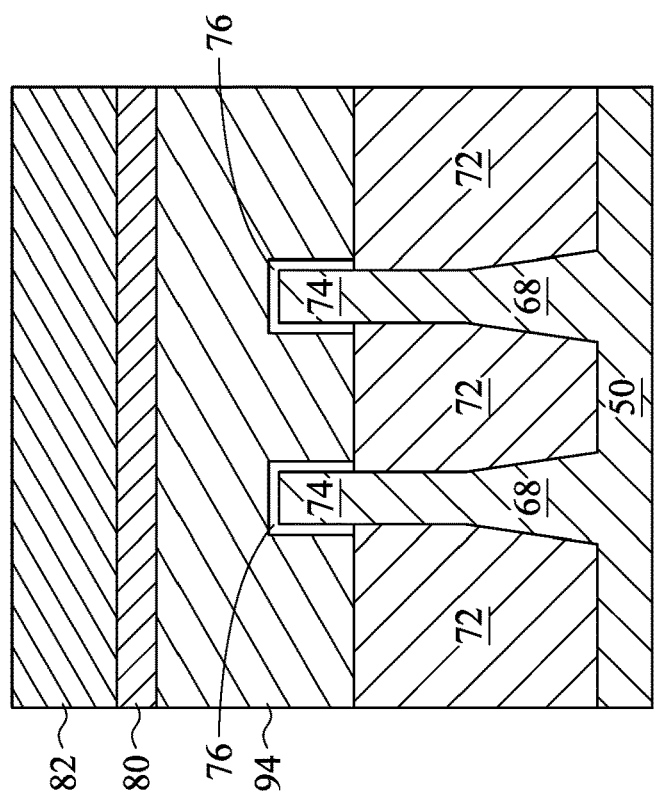
FIG. 22A
FIG. 22B

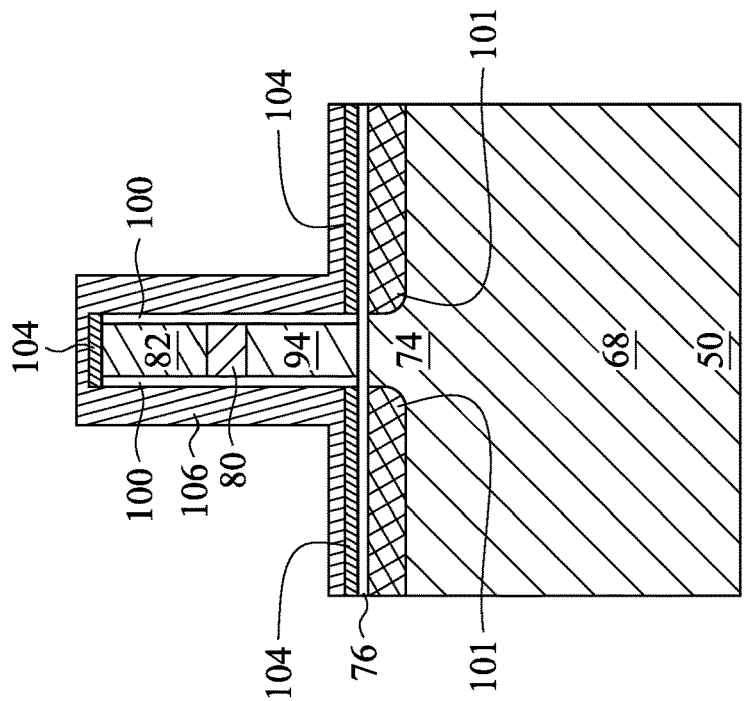
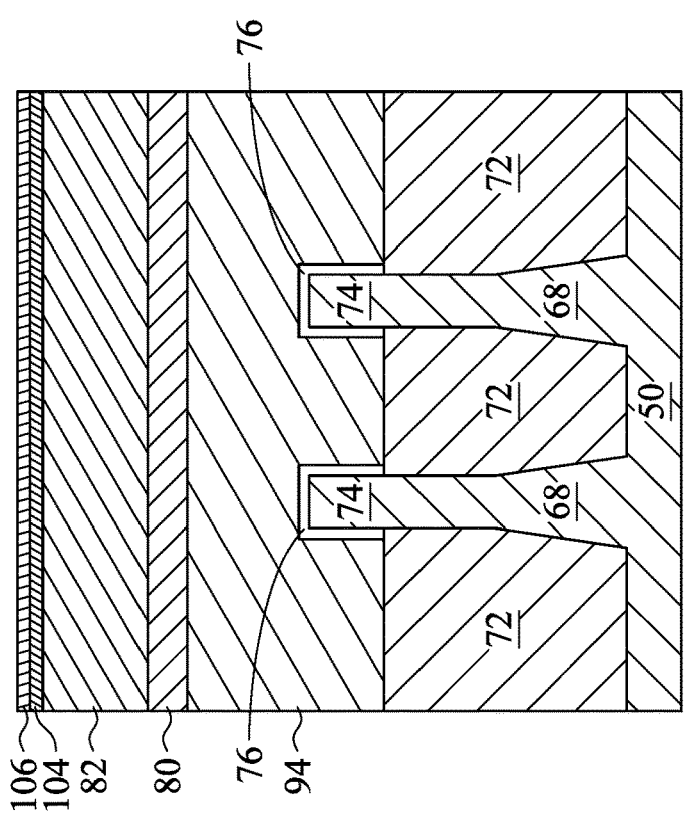
FIG. 24A
FIG. 24B

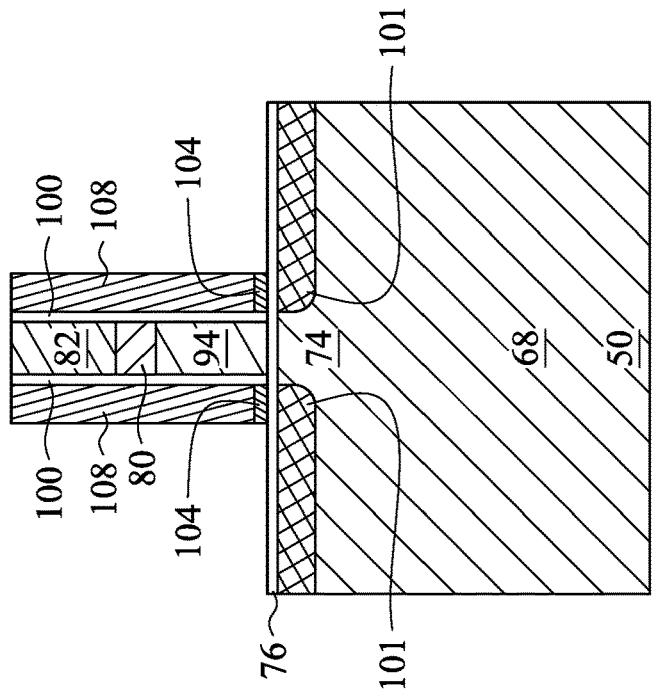
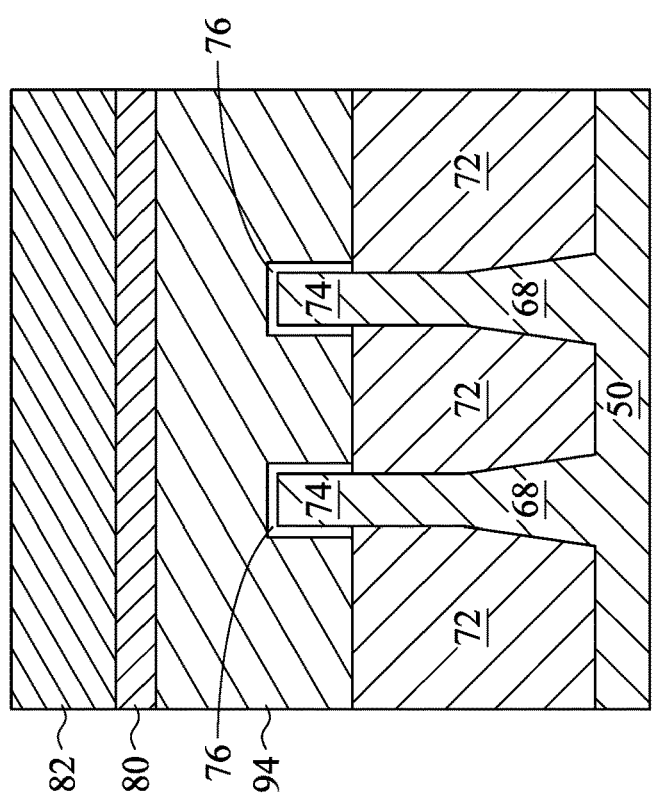

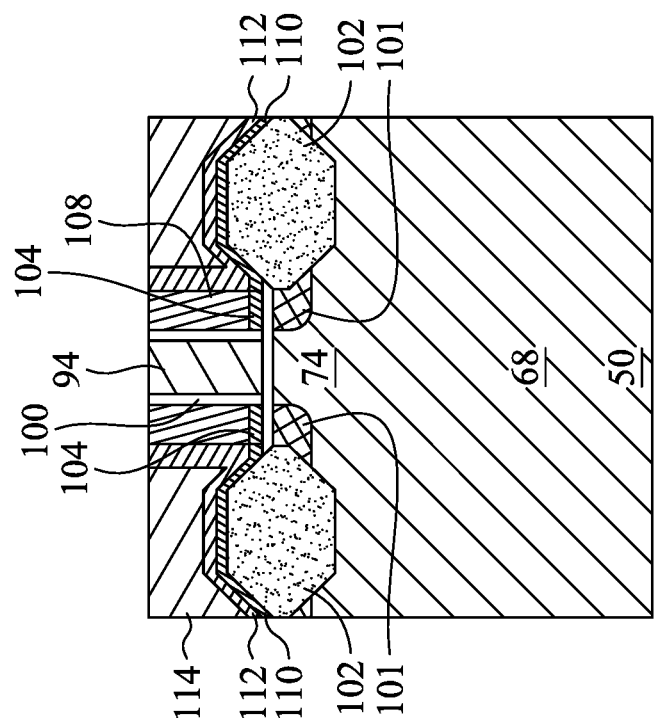
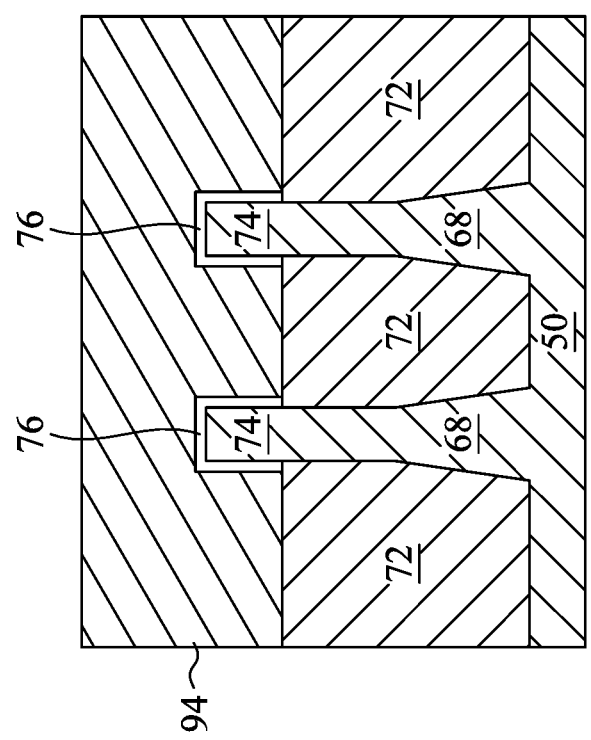
FIG. 30B
FIG. 30A

SEMICONDUCTOR DEVICE AND METHOD

PRIORITY CLAIM AND CROSS-REFERENCE

This application claims the benefit of U.S. Provisional Application No. 62/427,748, filed on Nov. 29, 2016, which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to electrical shorts between adjacent elements. As the demand for miniaturization, higher speed, and greater bandwidth has increased, there has grown a need for reducing the possibility of electrical shorts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, 11, 12, 13, 14, 15, 16, 17, 18, 19, 20, 21, 22A, 22B, 23A, 23B, 24A, 24B, 25A, 25B, 26A, 26B, 26C, 26D, 27A, 27B, 28A, 28B, 29A, 29B, 30A, 30B, 31A, 31B, 32A, 32B, 33A, 33B, 34A, 34B, 35A, 35B, 36A, and 36B are cross-sectional views of intermediate stages in the manufacturing of FinFETs, according to some embodiments.

DETAILED DESCRIPTION

Figure 1:
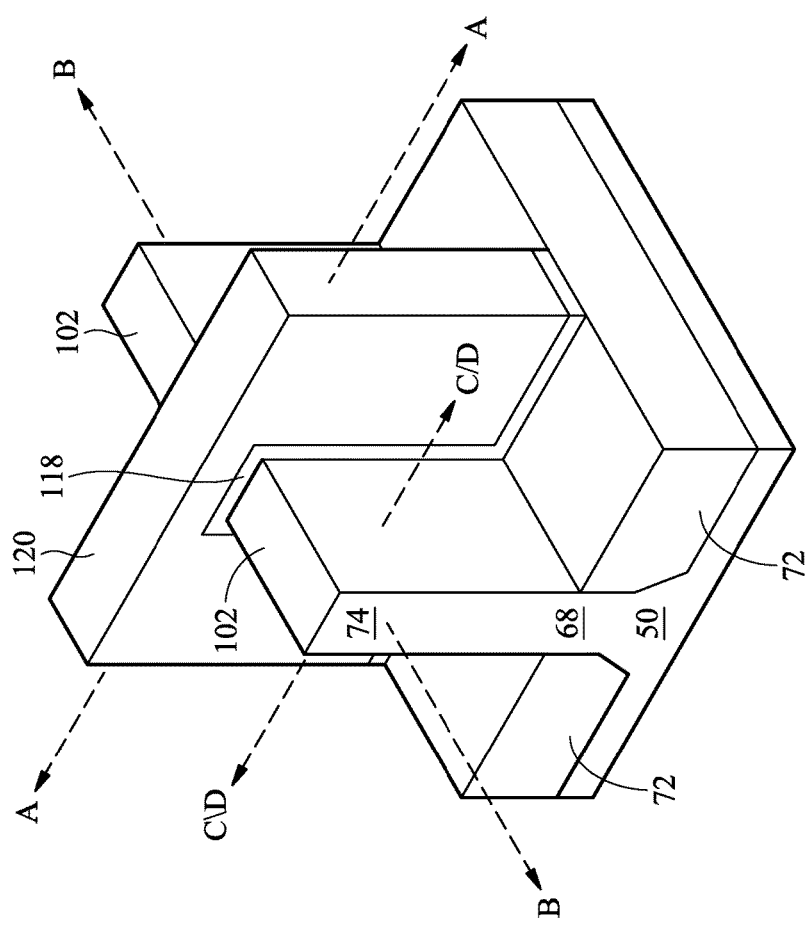
FIG. 1 illustrates an example of a FinFET in a three-dimensional view, according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device and method are provided, according to some embodiments. In particular, an ALD process is used to form a SiN layer in several intermediate stages of forming the semiconductor device. The SiN layer may be formed non-conformally. An etch coating layer is formed on surfaces where horizontal portions of the SiN layer will be formed. The etch coating layers inhibit the ALD process. As such, the ALD process results in vertical portions of the SiN layer being thicker than horizontal portions of the SiN layer. After removal of the horizontal portions, the remaining vertical portions may have a more defined square shape, may provide a better etch transfer window and uniformity in subsequent processing steps. The remaining vertical portions may be used to etch a target layer during intermediate stages of forming a finFET.

FIG. 1 illustrates an example of a FinFET in a three-dimensional view, according to some embodiments. The FinFET comprises a fin 74 on a substrate 50. Isolation regions 72 are on the substrate 50, and the fin 74 protrudes above and from between neighboring isolation regions 72. A gate dielectric layer 118 is along sidewalls and over a top surface of the fin 74, and a gate electrode 120 is over the gate dielectric layer 118. Source/drain regions 102 are disposed in opposite sides of the fin 74 with respect to the gate dielectric layer 118 and gate electrode 120. FIG. 1 further illustrates reference cross-sections that are used in later figures. Cross-section A-A is along a latitudinal axis of the fin 74, which extends in a direction of, for example, the gate electrode 120. Cross-section B-B is perpendicular to cross-section A-A and is along a longitudinal axis of the fin 74, which extends in a direction of, for example, a current flow between the source/drain regions 102. Subsequent figures refer to these reference cross-sections for clarity. Cross-section C/D-C/D is across a source/drain region 102 of the FinFET.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 36B are cross-sectional views of intermediate stages in the manufacturing of FinFETs, according to some embodiments. FIGS. 2 through 13 illustrate reference cross-section A-A in FIG. 1, except for multiple FinFETs. FIGS. 14 through 21 illustrate reference cross-section B-B in FIG. 1, except for multiple FinFETs. In FIGS. 22A through 36B, figures ending with an "A" designation are illustrated along reference cross-section A-A in FIG. 1, figures ending with a "B" designation are illustrated along a similar cross-section B-B, and figures ending with "C" and "D" designation are illustrated along a similar cross-section C/D-C/D, except for multiple FinFETs.

Figure 2:
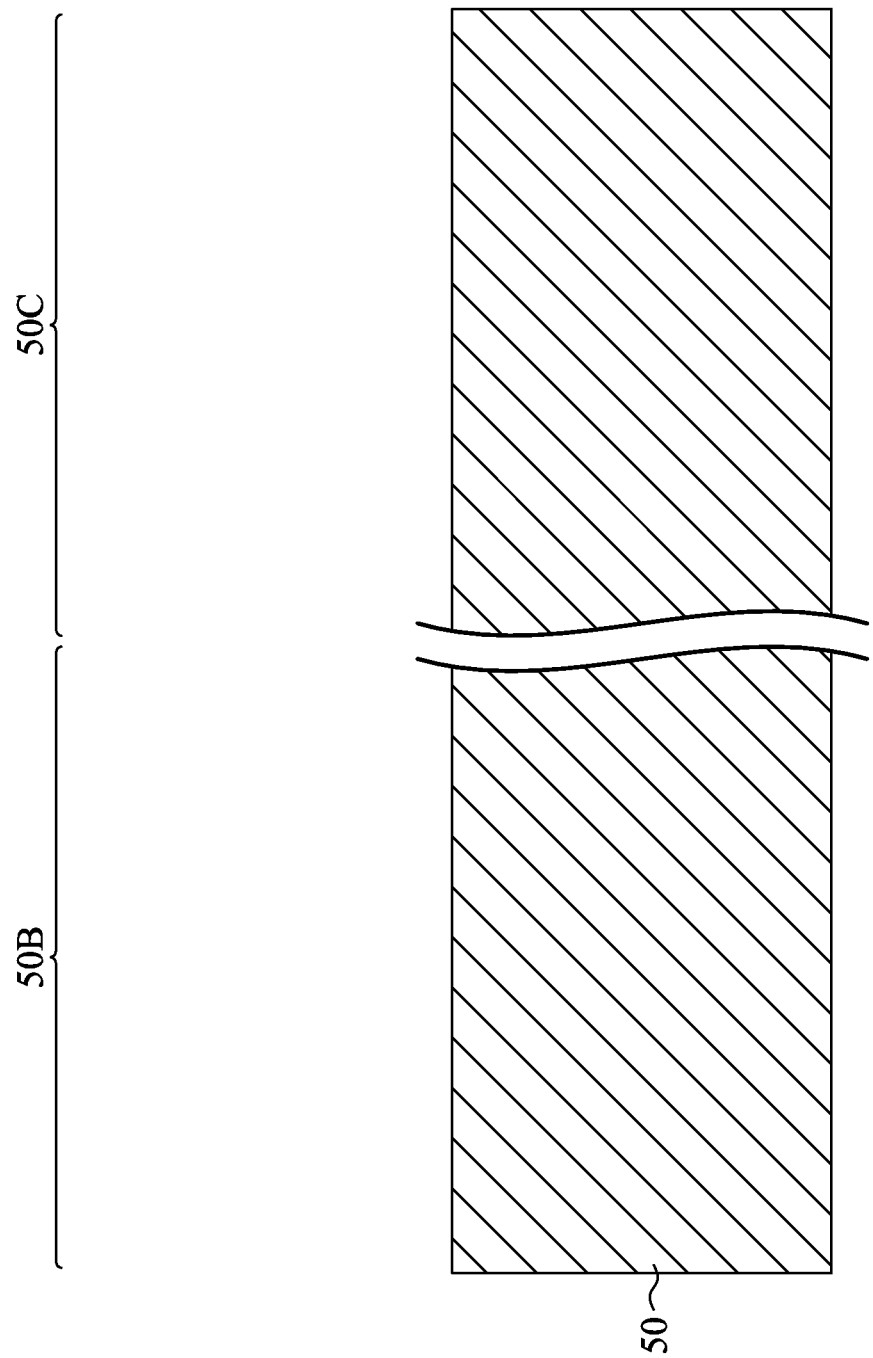

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B can be for forming n-type devices, such as NMOS transistors, e.g., n-type FinFETs. The second region 50C can be for forming p-type devices, such as PMOS transistors, e.g., p-type FinFETs. In some embodiments, both the first region 50B and the second region 50C are used to form the same type of devices, such as both regions being for n-type devices or p-type devices. The first region 50B and the second region 50C may be physically separated from each other, and any number of structures (e.g., isolation regions, active devices, etc.) may be disposed between the first region 50B and the second region 50C.

Figure 3:
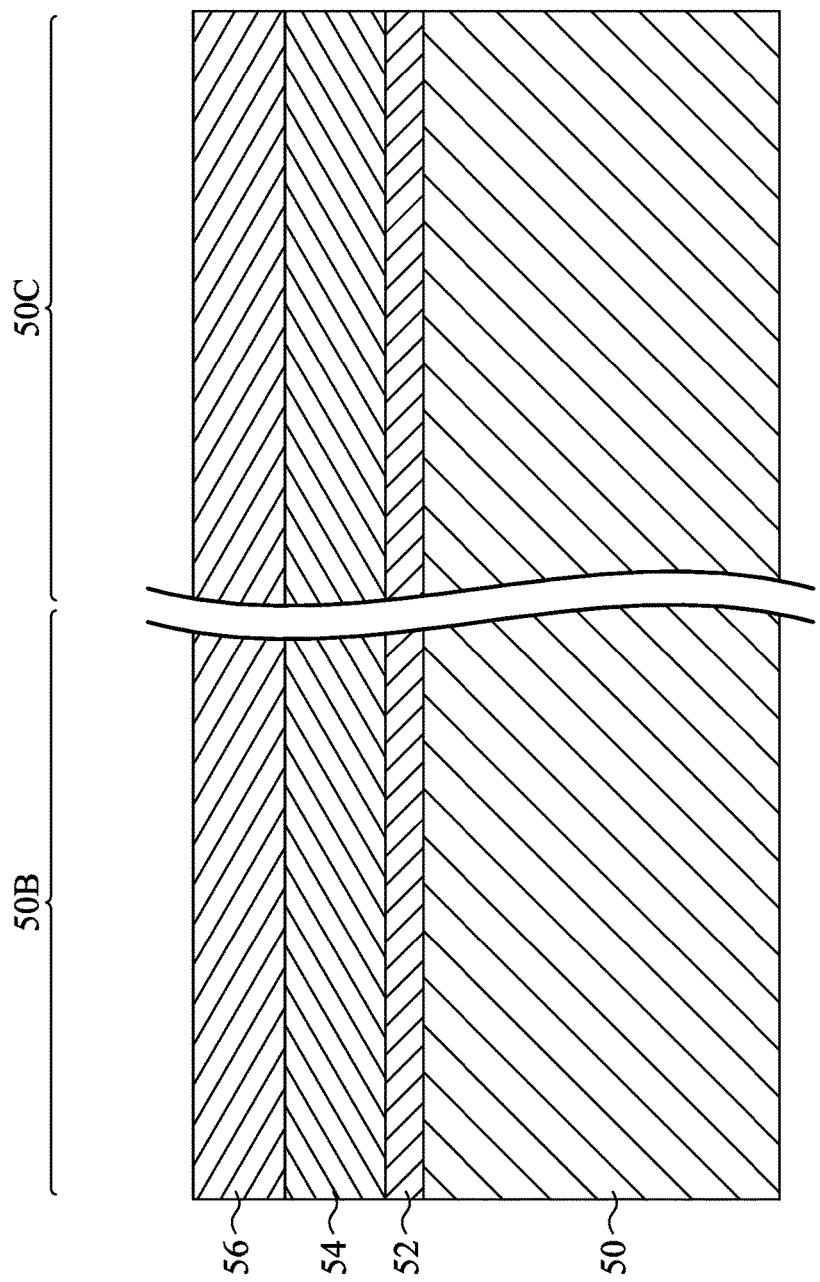

In FIG. 3, a film stack is formed over the substrate 50. The film stack is used during processing to form features in the substrate 50 that are a fraction of the minimum photolithographic pitch. In an embodiment, the process is a self-aligned double patterning (SADP) process, where the features formed are one half the minimum photolithographic pitch. In other embodiments, the process may be a self-align quadruple patterning (SAQP) process, where the features formed are one quarter of the minimum photolithographic pitch. The film stack includes an anti-reflective coating (ARC) 52, a mask layer 54, and a mandrel layer 56.

The ARC 52 is formed over the substrate 50, and aids in the exposure and focus of overlying photoresist layers (discussed below) during patterning of the photoresist layers. In some embodiments, the ARC 52 may be formed from SiON, SiC, materials doped with oxygen (O) and nitrogen (N), or the like. In some embodiments, the ARC 52 is substantially free from nitrogen, and may be formed from an oxide. In such embodiments, the ARC 52 may be also referred to as a nitrogen-free ARC (NFARC). The ARC 52 may be formed by Plasma Enhance Chemical Vapor Deposition (PECVD), High-Density Plasma (HDP) deposition, or the like.

The mask layer 54 is formed over the ARC 52. The mask layer 54 may be formed of a hard masking material, and may comprise a metal and/or a dielectric. In embodiments where the mask layer 54 comprises a metal, it may be formed of titanium nitride, titanium, tantalum nitride, tantalum, or the like. In embodiments where the mask layer 54 comprises a dielectric, it may be formed of an oxide, a nitride, or the like. The mask layer 54 may be formed by PVD, Radio Frequency PVD (RFPVD), Atomic Layer Deposition (ALD), or the like. In subsequent processing steps, a pattern is formed in the mask layer 54 as part of the SADP process. The mask layer 54 is then used as an etching mask, where the pattern of the mask layer 54 is transferred to the substrate 50.

The mandrel layer 56 is a sacrificial layer formed over the mask layer 54. The mandrel layer 56 is formed of a material that has a high etching selectivity with the underlying layer, e.g., with the mask layer 54. The mandrel layer 56 may be formed of a material such as amorphous silicon, polysilicon, silicon nitride, silicon oxide, the like, or a combination thereof, and may be formed using a process such as a chemical vapor deposition (CVD), PECVD, or the like. In an embodiment, the mandrel layer 56 is formed of polysilicon.

Figure 4:
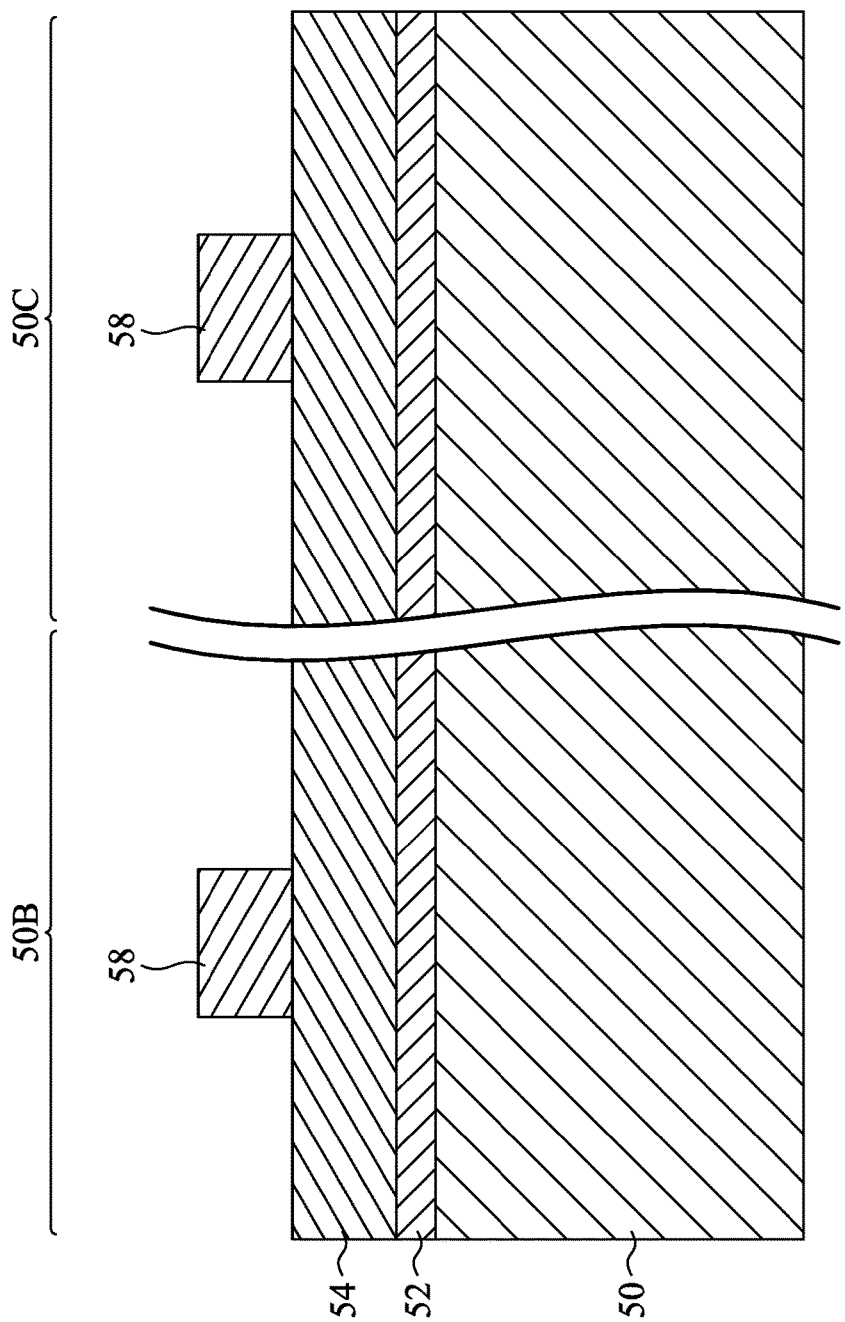

In FIG. 4, the mandrel layer 56 is patterned to form mandrels 58. The mandrel layer 56 may be patterned using any suitable photolithography technique. As an example of patterning the mandrel layer 56, a tri-layer photoresist (not shown) may be formed over the film stack. The tri-layer photoresist includes a bottom layer, a middle layer, and an upper layer.

The upper layer may be formed of a photosensitive material, such as a photoresist, which may comprise organic materials. The bottom layer may be a bottom anti-reflective coating (BARC). The middle layer may be formed of or include an inorganic material, which may be a nitride (such as silicon nitride), an oxynitride (such as silicon oxynitride), an oxide (such as silicon oxide), or the like. The middle layer has a high etching selectivity relative to the upper layer and the bottom layer. As a result, the upper layer is used as an etching mask for the patterning of the middle layer, and the middle layer is used as an etching mask for the patterning of the bottom layer.

The upper layer is patterned using any suitable photolithography technique after formation to form openings therein. As an example of patterning the upper layer, a photomask (not shown) may be disposed over the upper layer, which may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser. The ARC 52 may help focus the radiation beam. Exposure of the top photoresist layer may be performed using an immersion lithography system to increase resolution and decrease the minimum achievable pitch. A bake or cure operation may be performed to harden the upper layer, and a developer may be used to remove either the exposed or unexposed portions of the upper layer depending on whether a positive or negative resist is used.

After the patterning of the upper layer, an etching process is performed to transfer the pattern of the openings in the upper layer to the middle layer. The etching process may be anisotropic. After the pattern of the openings is transferred, the middle layer may be trimmed to adjust the sizes of the openings. After the trimming, the pitch of the openings in the middle layer may be about equal to the minimum photolithographic pitch.

After the trimming of the middle layer, an etching process is performed to transfer the pattern of the middle layer to the bottom layer. In some embodiments, the upper layer may be removed during the etching process of transferring the pattern of the middle layer to the bottom layer.

After the pattern is transferred to the bottom layer, an etching process is performed to transfer the pattern of the bottom layer to the mandrel layer 56. The etching process may remove the portions of the mandrel layer 56 exposed by the middle and bottom layers. In an embodiment, the etching process may be a dry etch where the mandrel layer 56 is exposed to a plasma source and one or more etchant gases. The etch may be an inductively coupled plasma (ICR) etch, a transformer coupled plasma (TCP) etch, an electron cyclotron resonance (ECR) etch, a reactive ion etch (RIE), or the like. Remaining portions of the mandrel layer 56 form the mandrels 58. In some embodiments, the etching process used to transfer the pattern to the mandrel layer 56 may remove the middle layer and partially remove portions of the bottom layer. An ashing process may be performed to remove remaining residue of the middle and/or bottom layers.

Figure 5:
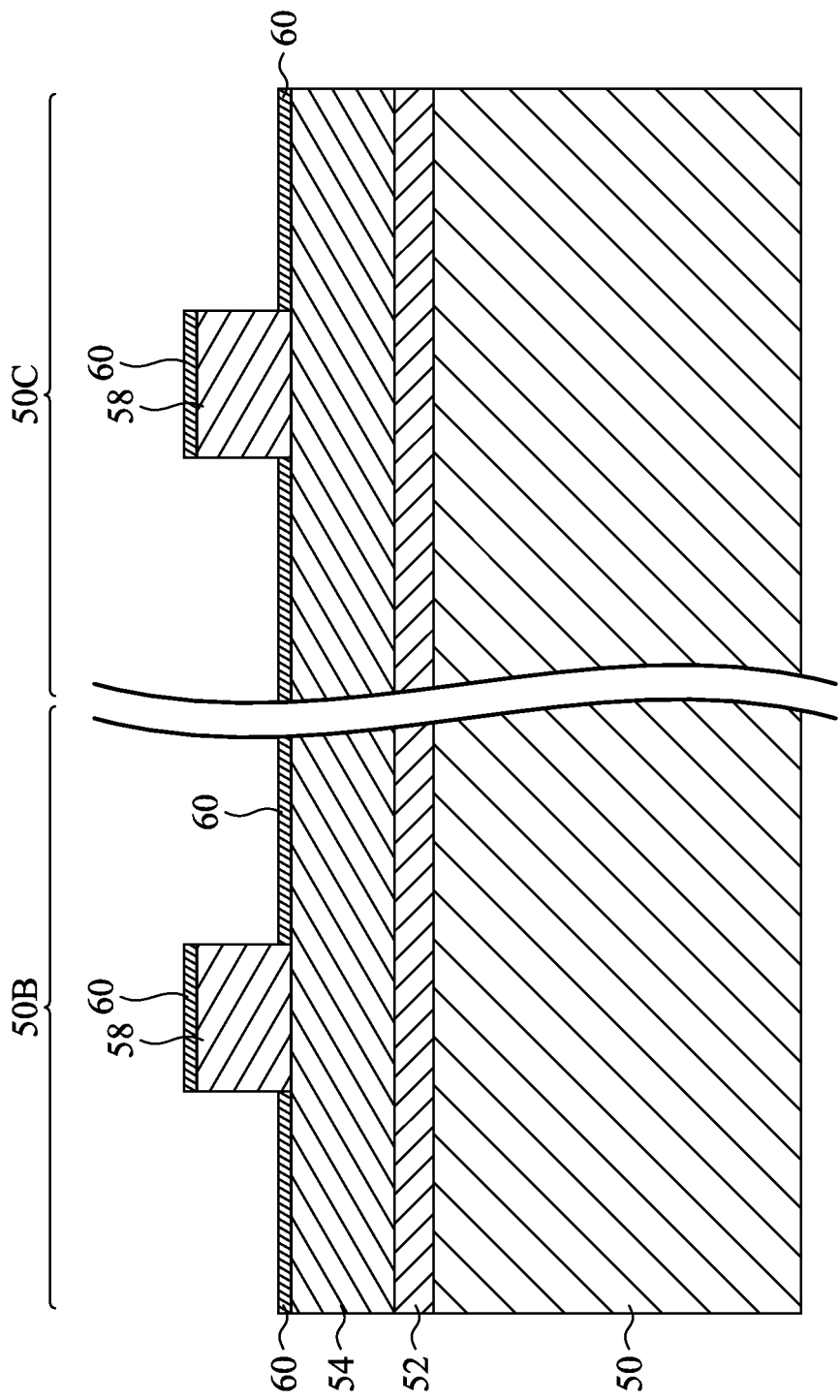

In FIG. 5, etch coating layers 60 are formed on top surfaces of the mask layer 54 and mandrels 58. The etch coating layers 60 are formed of a surface protection group material for the mask layer 54. The surface protection group material of the etch coating layers 60 may be $SiBrO_x$, $SiClO_x$, $SiO_x$, $CH_xF_y$, and/or the like, and may be produced from a reaction between a halide (e.g., F, Cl, Br, etc.) plasma or $O_2$ plasma and the material of an underlying layer (e.g., the materials of the mask layer 54 and the mandrels 58). In particular, material layers formed of organic materials, polysilicon, silicon, oxides, and/or SiN (e.g., the materials of the mask layer 54 and the mandrels 58) may react with the halide plasma or $O_2$ plasma to form the surface protection group material on the surface of the material layer. In an embodiment, the etch coating layers 60 is formed by performing a dry etching process that uses the halide plasma or $O_2$ plasma as an etchant, thereby conformally forming the surface protection group material as a byproduct of the etching process, and then performing a wet etching such that the etch coating layers 60 remain on the top surfaces of the mask layer 54 and mandrels 58. The surface protection group material of the etch coating layers 60 inhibits subsequent deposition processes on the surface of the material layer. In some embodiments, the etch coating layers 60 may be formed across the entire substrate 50. In some embodiments, a photoresist layer (not shown) may be used to define where the etch coating layers 60 are formed.

The dry etching process may be the dry etch used to pattern the mandrel layer 56. In an embodiment, the dry etch that produces the etch coating layers 60 is a TCP etch performed with a power of from 400 to 120 watts, and at a pressure of from 10 mTorr to 80 mTorr. The residue of the mask layer 54 and mandrel layer 56 may react with the process gasses and/or plasmas of the dry etching process to form a polymer byproduct, according to Equations (1) through (4), below. Controlling the etchant gasses, bias voltage, and duty cycle of the dry etching may allow control of the distribution of the polymer byproduct of the etched mandrel layer 56. The etchant gases used during the dry etching may include $CF_4$, $CHF_3$, $CH_2F_2$, $CH_3F$, $SF_6$, $NF_3$, combinations thereof, and the like. In an embodiment, the etchant gasses are a mixture of $SF_6$, and $CF_4$, and, respectively, are mixed at a ratio of in the range of 1:1 to 1:20; etchant gas ratios within this range result in partial etching that forms the mandrels 58 and leaves the etch coating layers 60 as residue. The plasma source for the dry etching may include a halide plasma or $O_2$ plasma. The bias voltage of the dry etch during patterning of the mandrel layer 56 may be controlled. In an embodiment, the bias voltage may be in a range of from about 50 volts to about 800 volts, such as about 200 volts. Controlling the bias voltage allows some polymer byproduct of the etching process to remain on the top surfaces of the mask layer 54 and mandrels 58. The duty cycle for the dry etching may also be controlled. In an embodiment, the duty cycle may be in a range of from about 3 cycles/minute to about 99 cycles/minute, such as about 50 cycles/minute. Controlling the duty cycle may allow the byproducts to further build on the top surfaces of the mask layer 54 and mandrels 58. The polymer byproduct of the etched mandrel layer 56 remaining on the top surfaces of the mask layer 54 and mandrels 58 forms the etching coating layer 60. In addition to acting as the plasma source for the dry etching, the plasma source may also react with the residual material of the etched layers to help form the surface protection group material of the etch coating layers 60. For example, in embodiments where the mandrel layer 56 is formed from Si, the surface protection group material may, depending on the plasma used, be formed according to one or more of:

$$Si+HBr+O_x \rightarrow SiBrO_x, \quad (1)$$

$$Si+Cl_2+O_2 \rightarrow SiClO_x, \text{ or} \quad (2)$$

$$Si+O_2 \rightarrow SiO_x. \quad (3)$$

In Equations (1), (2), and (3), x may be from 1 to 3, HBr and $Cl_2$ are etchants, and $O_2$ is a plasma source. The $SiBrO_x$, $SiClO_x$, or $SiO_x$ formed is the surface protection group material. In embodiments where the mandrel layer 56 is formed from $CH_x$, the surface protection group material may, depending on the plasma used, be formed according to:

$$CH_x+F_y \rightarrow CH_xF_y. \quad (4)$$

In Equation (4), the ratio of x to y may be from 1 to 3, and $F_y$ is a plasma source. The $CH_xF_y$ formed is the surface protection group material.

In some embodiments, a wet cleaning process is performed after the dry etching process. The wet cleaning process may optimize or at least improve the formation of the etch coating layers 60. In an embodiment, the wet cleaning process is an anisotropic wet etch used to remove residual mandrel material from the sidewalls of the mandrels 58. In particular, the time of the wet cleaning process may be controlled so that the polymer byproduct is removed from the sidewalls of the mandrels 58, but not the top surfaces of the mandrels 58 or the mask layer 54. The etchants of the etching process may be HF, $NH_4OH$, HCl, $H_2O_2$, $H_2SO_4$, combinations thereof, or the like. The wet etching process may be performed at a temperature of between about 0° C. and about 100° C., such as about 70° C.

Figure 6:
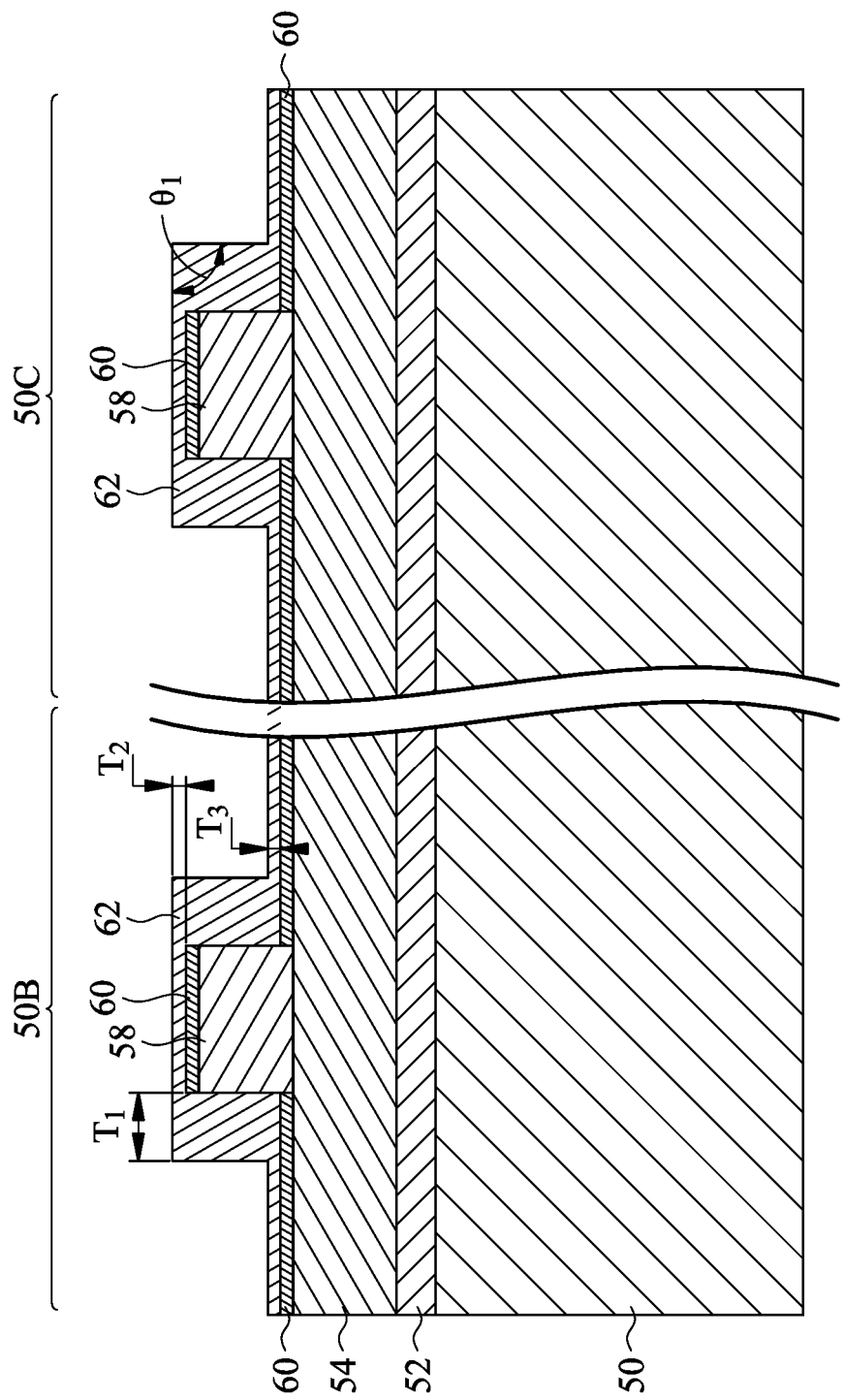

In FIG. 6, a spacer layer 62 is formed on the etch coating layers 60, e.g., over the mask layer 54 and mandrels 58. After formation, the spacer layer 62 extends along top surfaces of the mask layer 54 and mandrels 58, and sidewalls of the mandrels 58. The material of the spacer layer 62 is selected to have a high etching selectivity with the mask layer 54. The spacer layer 62 may be formed from AlO, AlN, AlON, TaN, TiN, TiO, Si, SiO, SiN, metals, metal alloys, and the like, and may be deposited using any suitable process such as ALD, CVD, or the like.

In an embodiment, the spacer layer 62 is formed of SiN with an ALD process. In such embodiments, the tool used to perform the ALD may be a Tokyo Electron (TEL) INDY+. Process gasses for the ALD may include dichlorosilane (DCS) and $NH_3$. The silicon sources of the ALD process may be silane, disilane, and the like. The ALD process may be performed at a pressure of from about 0 Torr to about 10 Torr; at a temperature of from about 250° C. to about 600° C., such as less than 500° C.; and at a power of from about 50 W to about 300 W. During the ALD process, the spacer layer 62 does not form as quickly on the etch coating layers 60 as the it does on the sidewalls of the mandrels 58. In particular, monolayers formed by the ALD process are unable to form or have difficulty forming on the surfaces having the etch coating layers 60. The ALD process may have two periods. In the first period, the ALD process forms SiN monolayers on the sidewalls of the mandrels 58 at a first deposition rate, and either does not form monolayers on the etch coating layers 60, or forms the monolayers on the etch coating layers 60 at a second deposition rate lower than the first deposition rate. The first period continues until the etch coating layers 60 are sufficiently covered by the spacer layer 62 that they no longer inhibit the ALD process. The ALD process then continues in the second period after the first period. In the second period, SiN monolayers are formed on all surfaces (e.g., the top surfaces of the mandrels 58 and mask layer 54, and the sidewalls of the mandrels 58) at a third deposition rate. The third deposition rate is greater than the second deposition rate, and may be greater than, equal to, or less than the first deposition rate. In an embodiment, the third deposition rate is equal to the first deposition rate.

Because the etch coating layers 60 inhibit the ALD process, the spacer layer 62 is formed as a non-conformal layer. In other words, the spacer 62 is not formed to have a same thickness across the substrate 50, but rather has varying thicknesses. In particular, the thickness $T_1$ of the vertical portions of the spacer layer 62 (along the sidewalls of the mandrels 58) is larger than the thickness $T_2$ of the horizontal portions along the tops of the mandrels 58, and is larger than the thickness $T_3$ of the horizontal portions along the top of the mask layer 54. The thickness $T_2$ may be greater than or equal to the thickness $T_3$. In an embodiment, the thickness $T_1$ of the vertical portions is from 3 to 10 times larger than the thickness $T_2$ of the horizontal portions.

Because the thickness $T_1$ is larger than the thicknesses $T_2/T_3$, the spacer layer 62 may have more defined corners. In particular, the corners of the spacer layer 62 may have an internal angle $\theta_1$ of from about 85 degrees to about 90 degrees. More defined corners may provide a better etch transfer window and uniformity in subsequent processing steps.

Figure 7:
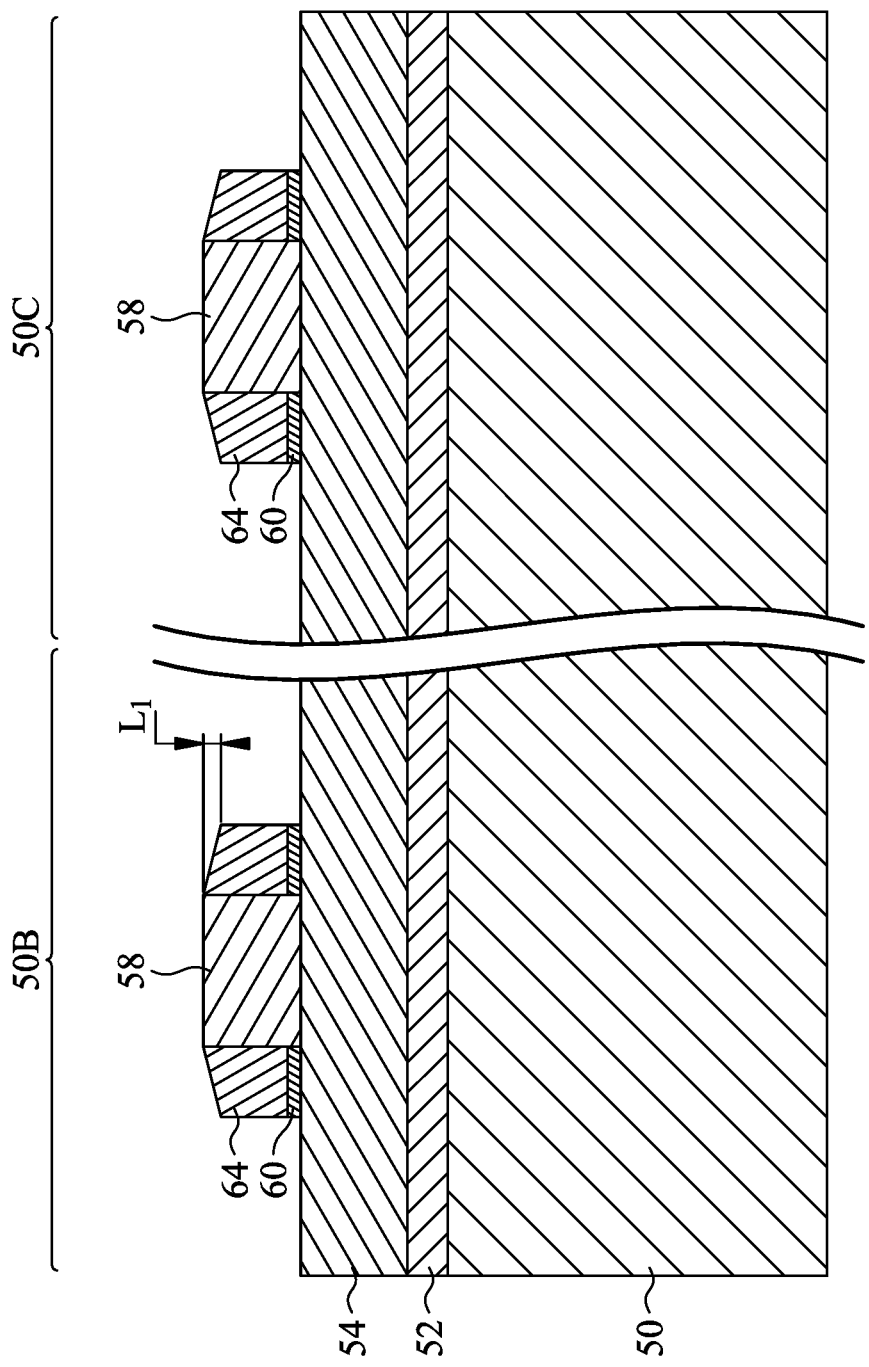

In FIG. 7, a suitable etching process is performed to remove the horizontal portions of the spacer layer 62. In some embodiments, the etchant used to etch the horizontal portions of the spacer layer 62 is $Cl_2$, $CH_4$, $N_2$, Ar, the like, or a combination thereof. The etching process also removes portions of the etch coating layers 60 underlying the removed portions of the spacer layer 62. After the etching process, the vertical portions of the spacer layer 62 remain along the sides of the mandrels 58, and are referred to as spacers 64 hereinafter. Remaining portions of the etch coating layers 60 are under the spacers 64. The etching process may be anisotropic, so that the thickness $T_1$ of the spacers 64 does not significantly decrease.

Because the thicknesses $T_2/T_3$ of the horizontal portions are less than the thickness $T_1$ of the vertical portions, the etching process to remove the horizontal portions may be short. In particular, the etching process for removing horizontal portions of the non-conformal spacer layer 62 may take less time than an etching process for removing horizontal portions of a conformal spacer layer. In an embodiment, the etching process is an anisotropic wet etch. The wet etchants may include dilute hydrofluoric (dHF) acid, a sulfuric peroxide mixture (SPM), de-ionized water, or the like, and the etching process may be performed for a time of from about 10 seconds to about 300 seconds, such as about 100 seconds. Because the etching process to remove the horizontal portions may be completed quickly, material loss of the spacers 64 may be avoided. In some embodiments, portions of the spacers 64 distal the mandrels 58 may undergo a top loss $L_1$ of from about 0% to about 5% of the height of the spacers 64, resulting in the corners of the spacer layer 62 having facets with an internal angle $\theta_1$ of from about 85 degrees to about 90 degrees. Longer etching process may cause top losses of up to 25%, resulting in the spacers 64 having facets with larger internal angles. A shorter etching time may reduce the probability of over-etching, thereby avoiding corner losses and improving the slope of the top surfaces of the spacers 64. In an embodiment, the spacers 64 may experience a top loss $L_1$ of less than 5 nm. More defined square corners may help avoid short circuits in resulting devices when the spacers 64 are used in subsequent etching steps.

Figure 8:
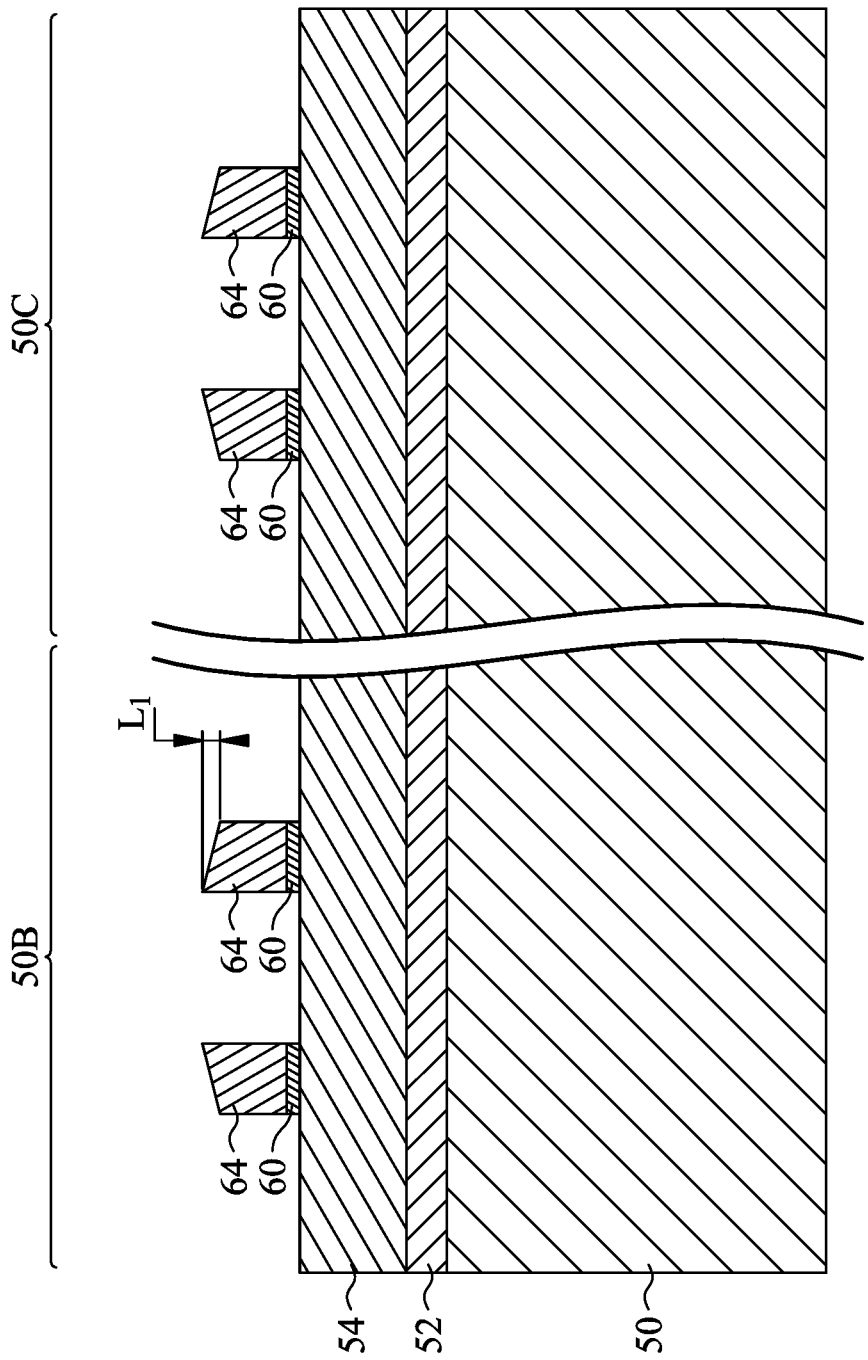

In FIG. 8, the mandrels 58 are removed. The mandrels 58 may be removed by a suitable etching processes, such as by an etch process including etchants such as $CF_4$, $CH_3F$, $H_2$, $N_2$, Ar, the like, or a combination thereof or any other suitable etchant that can remove the mandrels 58 without substantially damaging the spacers 64. Further, a wet clean process may also be applied to substrate 50 to remove residual spacer and mandrel material. In some embodiments, the spacer etch and the mandrel removal processes are performed in a same process chamber.

Figure 9:
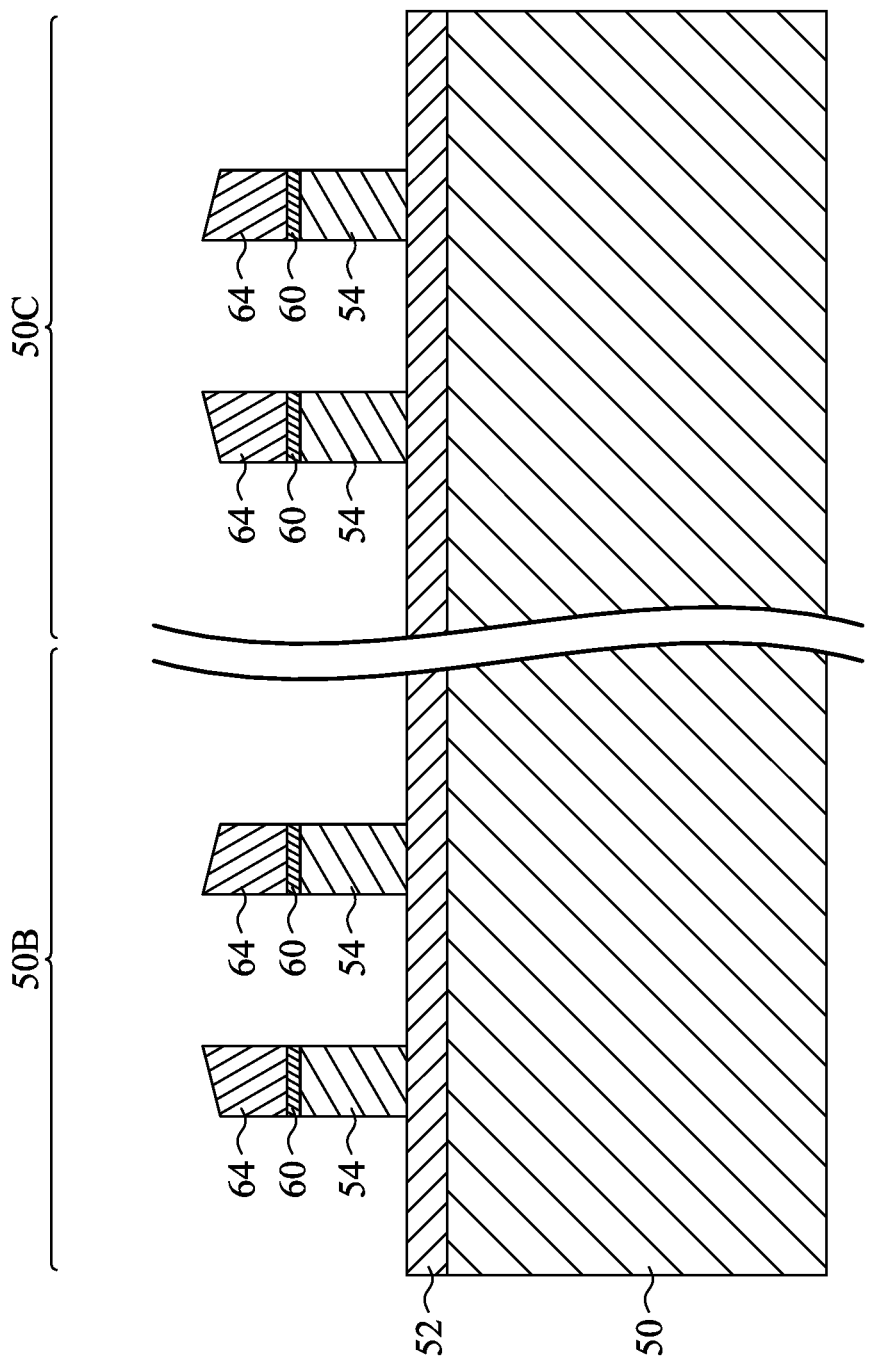

In FIG. 9, the spacers 64 are used as an etching mask to pattern the mask layer 54. A suitable etching process, such as an anisotropic etch, may be performed with any suitable chemical, such as $CF_4$, HBr, $Cl_2$, $O_2$, Ar, the like, or a combination thereof. The pattern of the spacers 64 is therefore transferred to the mask layer 54 to form openings in the mask layer 54.

Figure 10:
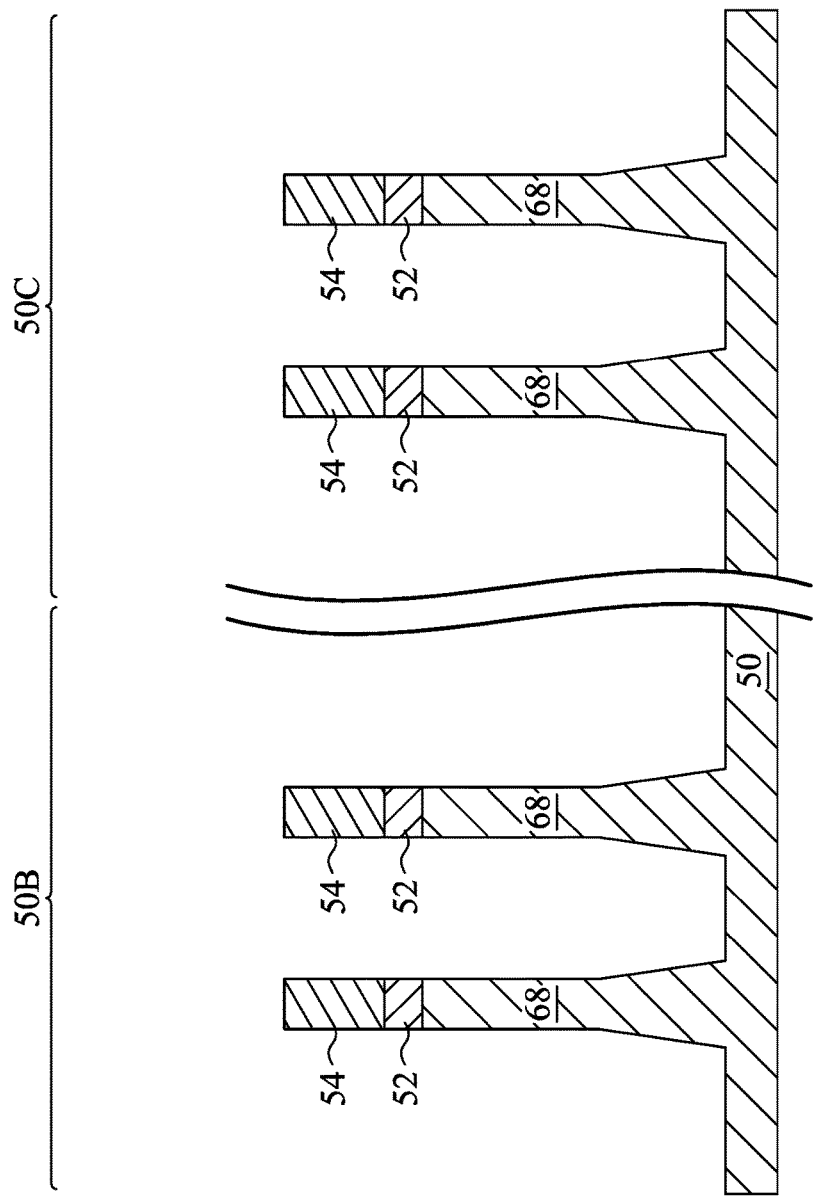

In FIG. 10, fins 68 are formed in the substrate 50. The fins 68 are formed by using the patterned mask layer 54 as an etching mask to etch the ARC 52 and the substrate 50, thereby forming trenches in the substrate 50. The resulting semiconductor strips between the trenches form the fins 68. The etching may be any acceptable etch process, and may use etchants such as $Cl_2$, $N_2$, $CH_4$, the like, or a combination thereof. The etch may be anisotropic. The spacers 64, etch coating layers 60, patterned mask layer 54, and the patterned ARC 52 may be consumed in this process. In some embodiments, a cleaning process may be performed to remove any residual material of the spacers 64, the etch coating layers 60, the patterned mask layer 54, and the patterned ARC 52.

Although the SADP process illustrated in FIGS. 3 through 10 is used to form the fins 68, it should be appreciated that the fabrication steps shown in FIGS. 3 through 10 may be used in any SADP processes. In particular, the spacers 64 could be formed over and used to pattern other semiconductor device elements such as polysilicon gates, metal gates, dummy gates, isolation regions, interconnect structures, gate spacers, a contact etch stop layer (CESL), and the like.

Figure 11:
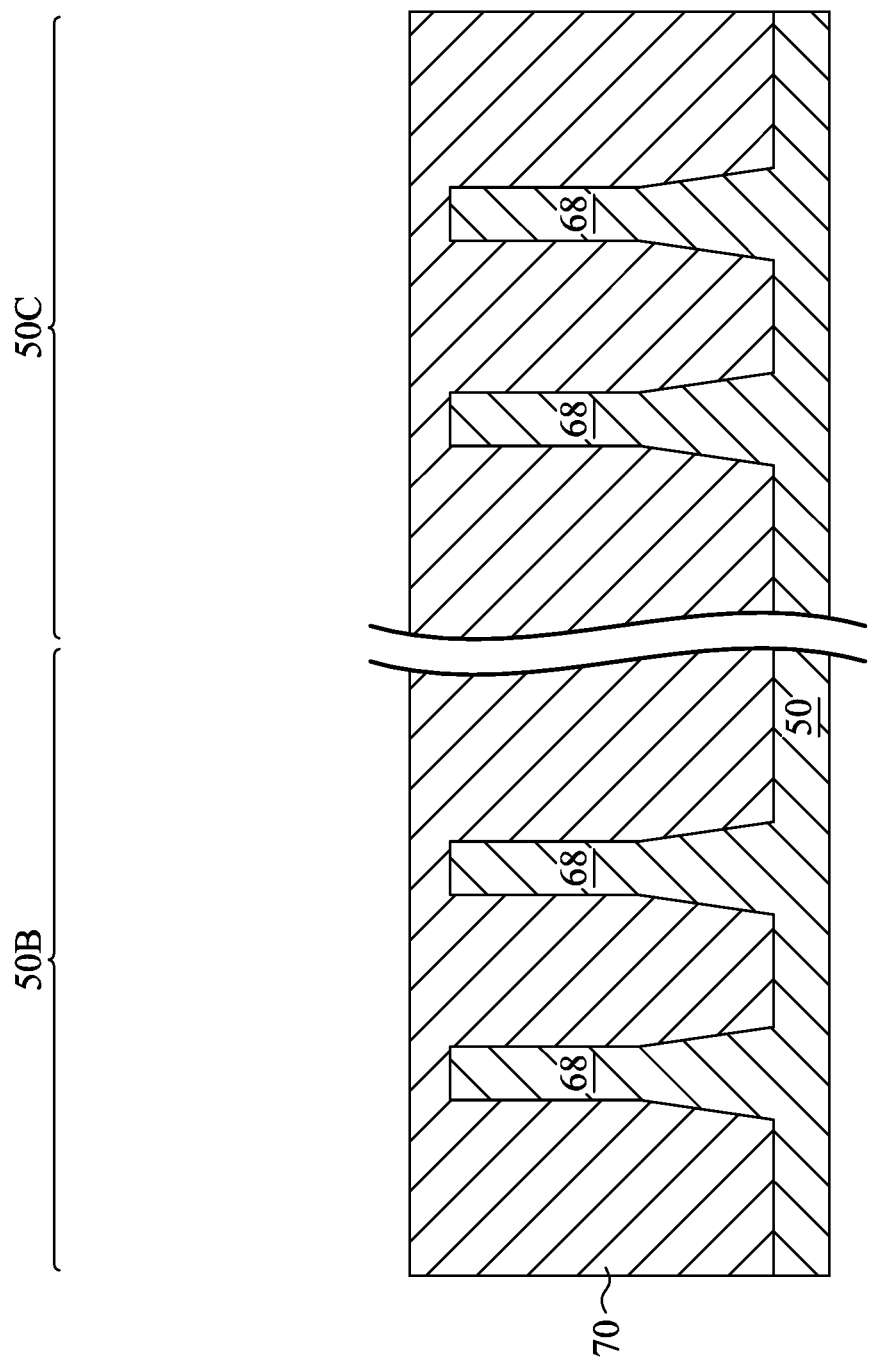

In FIG. 11, an insulation material 70 is formed over the substrate 50 and between neighboring fins 68. The insulation material 70 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 70 is silicon oxide formed by a FCVD process. An anneal process may be performed once the insulation material is formed. In some embodiments (not shown) a planarization process such as a grind or a chemical-mechanical polish (CMP) may be performed to expose the top surfaces of the fins 68.

Figure 12:
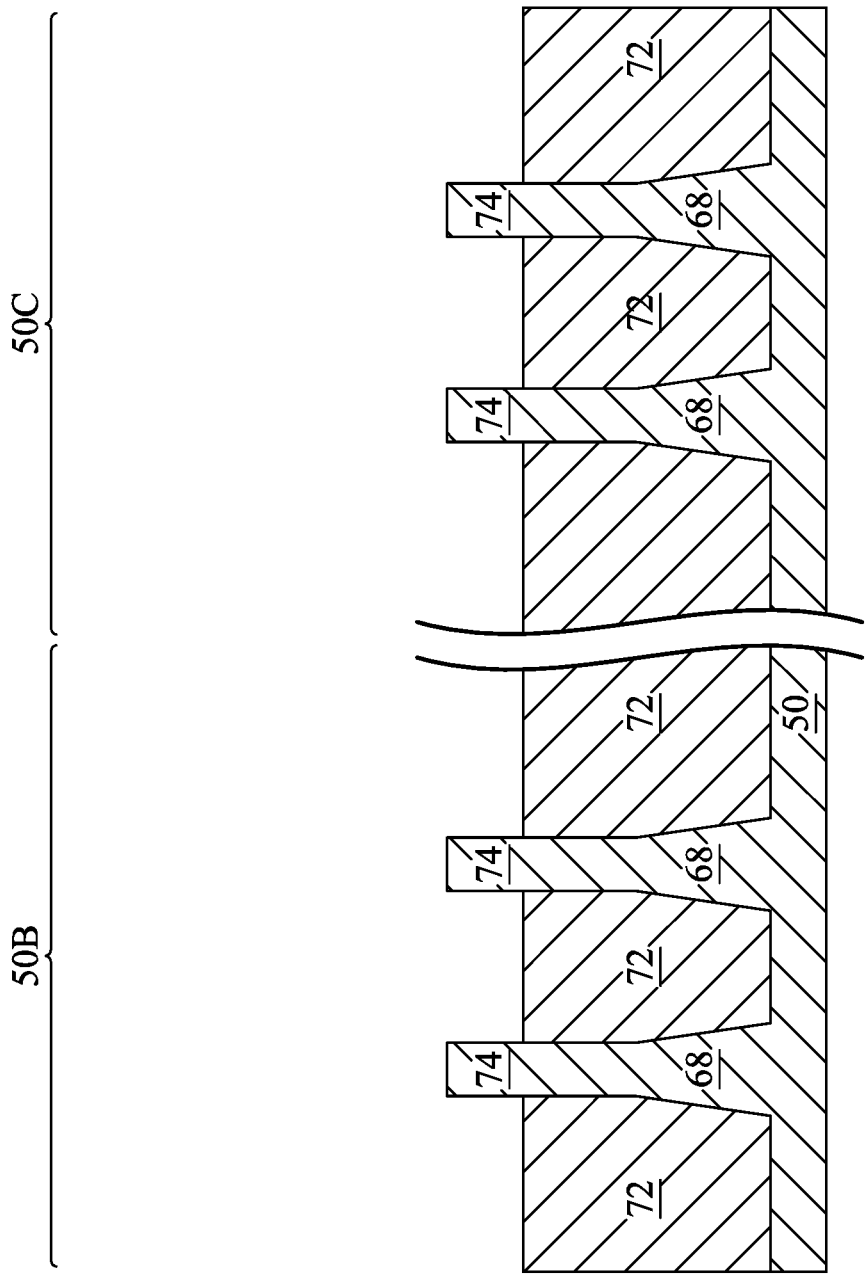

In FIG. 12, the insulation material 70 is recessed to form Shallow Trench Isolation (STI) regions 72. The insulation material 70 is recessed such that fins 68 in the first region 50B and in the second region 50C protrude from between neighboring STI regions 72. Further, the top surfaces of the STI regions 72 may have a flat surface as illustrated, a convex surface, a concave surface (such as dishing), or a combination thereof. The top surfaces of the STI regions 72 may be formed flat, convex, and/or concave by an appropriate etch. The STI regions 72 may be recessed using an acceptable etching process, such as one that is selective to the material of the insulation material 70. For example, a chemical oxide removal using a CERTAS® etch or an Applied Materials SICONI tool or dilute hydrofluoric (dHF) acid may be used.

Further in FIG. 12, appropriate wells (not shown) may be formed in the fins 74, the fins 68, and/or the substrate 50. In some embodiments, a P well may be formed in the first region 50B, and an N well may be formed in the second region 50C. In some embodiments, a P well or an N well are formed in both the first region 50B and the second region 50C.

In the embodiments with different well types, the different implant steps for the first region 50B and the second region 50C may be achieved using a photoresist or other masks (not shown). For example, a photoresist may be formed over the fins 74 and the STI regions 72 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the second region 50C, a photoresist is formed over the fins 74 and the STI regions 72 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region 50C, such as the PMOS region. The p-type impurities may be boron, BF$_2$, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the first region 50B and the second region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 13:
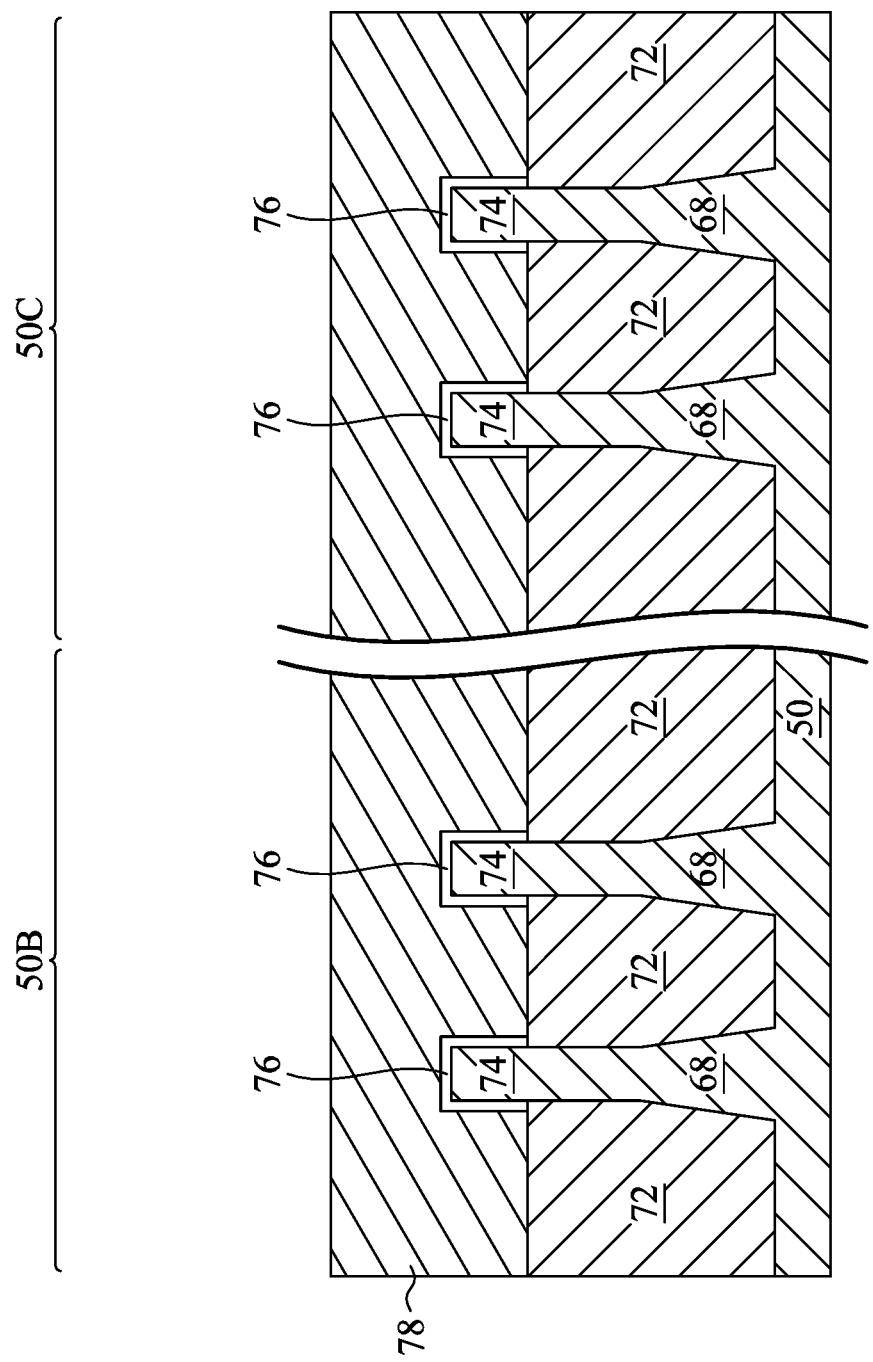

In FIG. 13, a dummy dielectric layer 76 is formed on the fins 74. The dummy dielectric layer 76 may be, for example, silicon oxide, silicon nitride, a combination thereof, or the like, and may be deposited or thermally grown according to acceptable techniques (e.g., thermal oxidation). A dummy gate layer 78 is formed over the dummy dielectric layer 76 The dummy gate layer 78 may be deposited over the dummy dielectric layer 76 and then planarized, such as by a CMP. The dummy gate layer 78 may be a conductive material and may be selected from a group including polycrystalline-silicon (polysilicon), poly-crystalline silicon-germanium (poly-SiGe), metallic nitrides, metallic silicides, metallic oxides, and metals. In an embodiment, amorphous silicon is deposited and recrystallized to create polysilicon. The dummy gate layer 78 may be deposited by physical vapor deposition (PVD), CVD, sputter deposition, or other techniques known and used in the art for depositing conductive materials. The dummy gate layer 78 may be made of other materials that have a high etching selectivity from the etching of isolation regions. In this example, a single dummy gate layer 78 is formed across the first region 50B and the second region 50C. In some embodiments, separate dummy gate layers may be formed in the first region 50B and the second region 50C.

Figure 14:
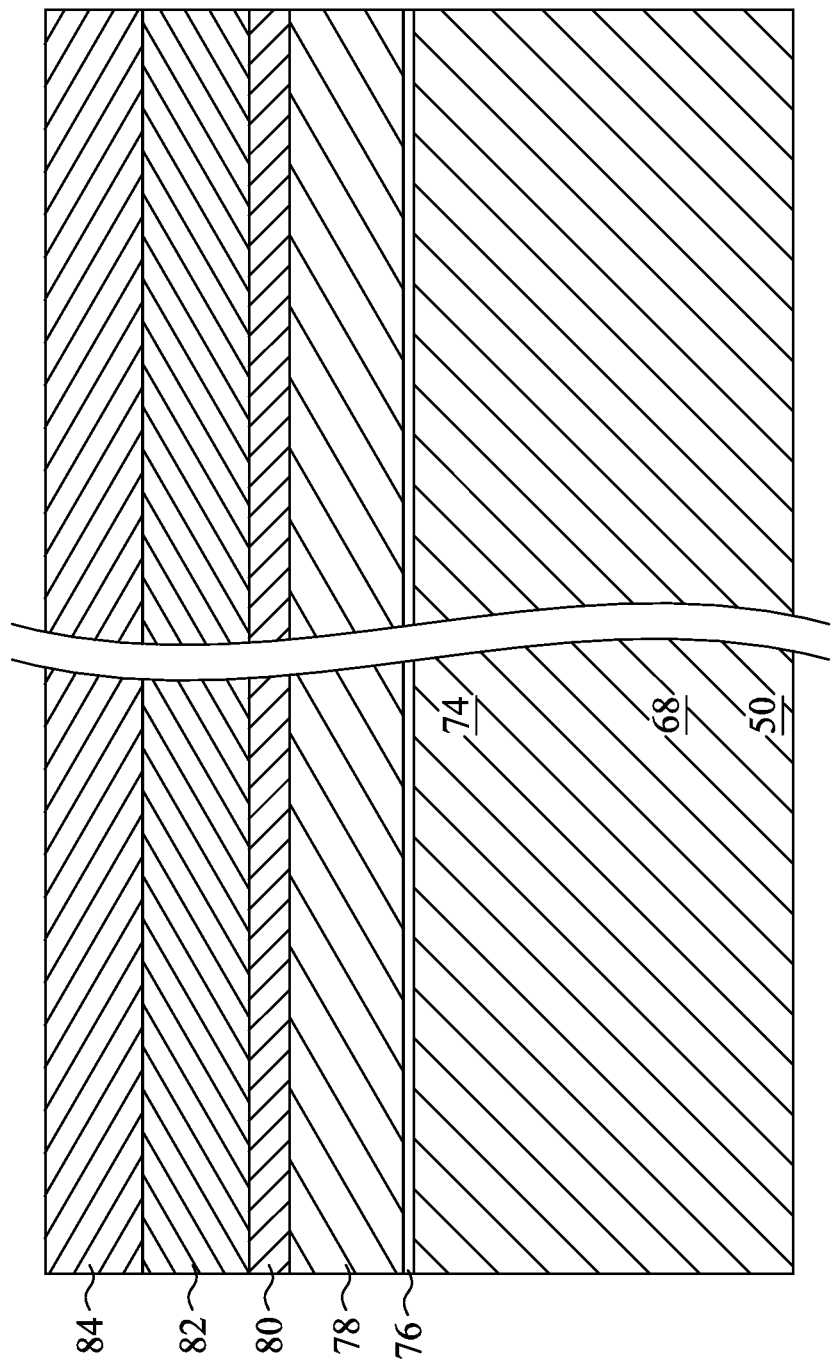

In FIG. 14, a film stack is formed over the dummy gate layer 78. The film stack is used during processing to form features in the dummy gate layer 78 that are a fraction of the minimum photolithographic pitch. In an embodiment, the process is a SADP process. In other embodiments, the process may be a SAQP process. The film stack includes an ARC 80, a mask layer 82, and a mandrel layer 84.

The ARC 80 is formed over the dummy gate layer 78. The ARC 80 may be formed of a material selected from the same candidate material of the ARC 52, and may be formed using a method that is selected from the same group of candidate methods for forming the ARC 52. The ARCs 52 and 80 may be formed of the same material, or may comprise different materials.

The mask layer 82 is formed over the ARC 80. The mask layer 82 may be formed of a material selected from the same candidate material of the mask layer 54, and may be formed using a method that is selected from the same group of candidate methods for forming the mask layer 54. The mask layers 54 and 82 may be formed of the same material, or may comprise different materials.

The mandrel layer 84 is formed over the mask layer 82. The mandrel layer 84 may be formed of a material selected from the same candidate material of the mandrel layer 56, and may be formed using a method that is selected from the same group of candidate methods for forming the mandrel layer 56. The mandrel layers 56 and 84 may be formed of the same material, or may comprise different materials.

Figure 15:
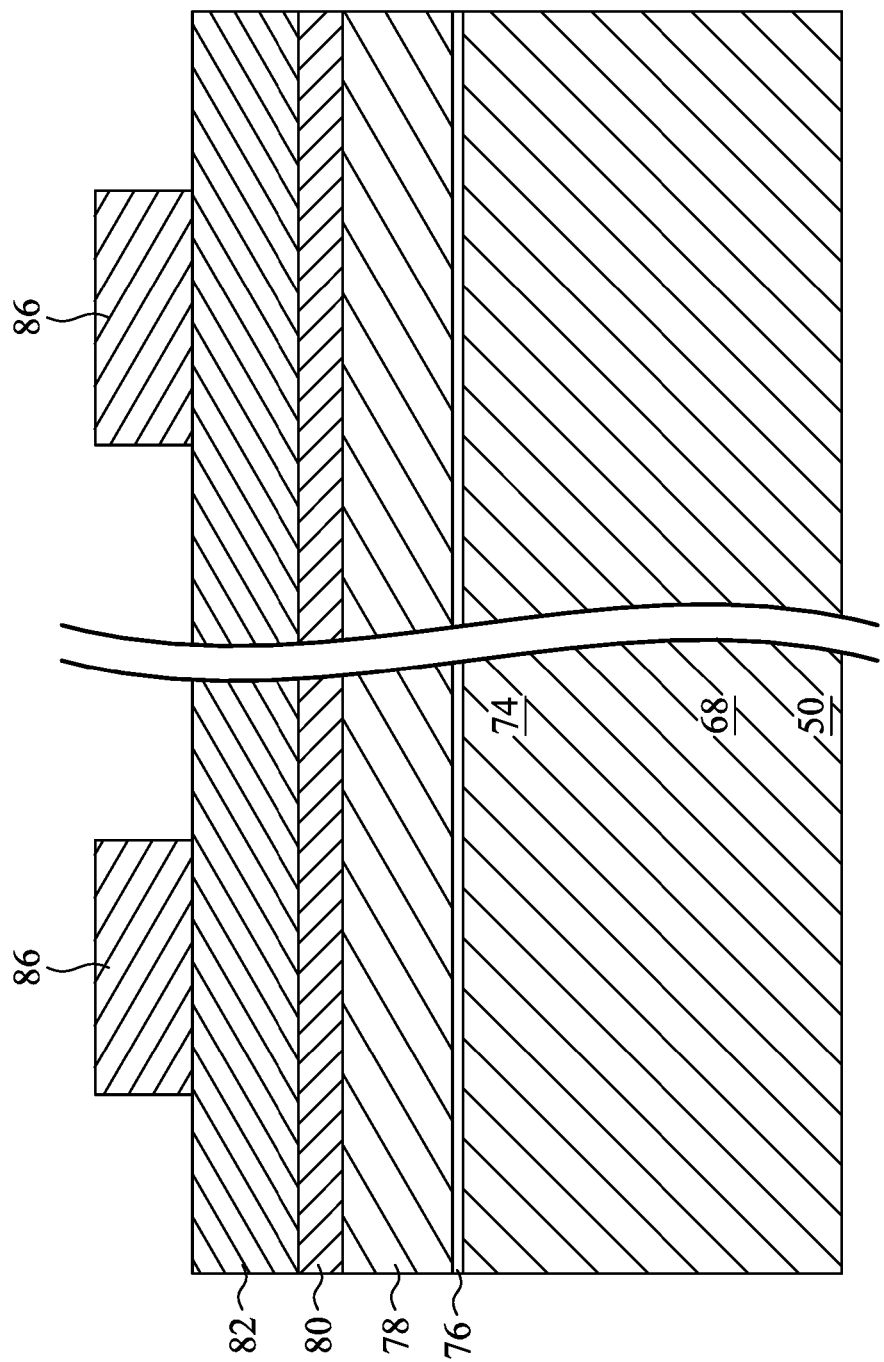

In FIG. 15, the mandrel layer 84 is patterned to form mandrels 86. The mandrel layer 84 may be patterned using any suitable photolithography technique. As an example of patterning the mandrel layer 84, a tri-layer photoresist (not shown) may be formed over the film stack. The tri-layer photoresist includes a bottom layer, a middle layer, and an upper layer. The photoresist may be patterned with the pattern of the mandrels 86, and an etching process may remove the portions of the mandrel layer 84 exposed by the photoresist. Remaining portions of the mandrel layer 84 form the mandrels 86.

Figure 16:
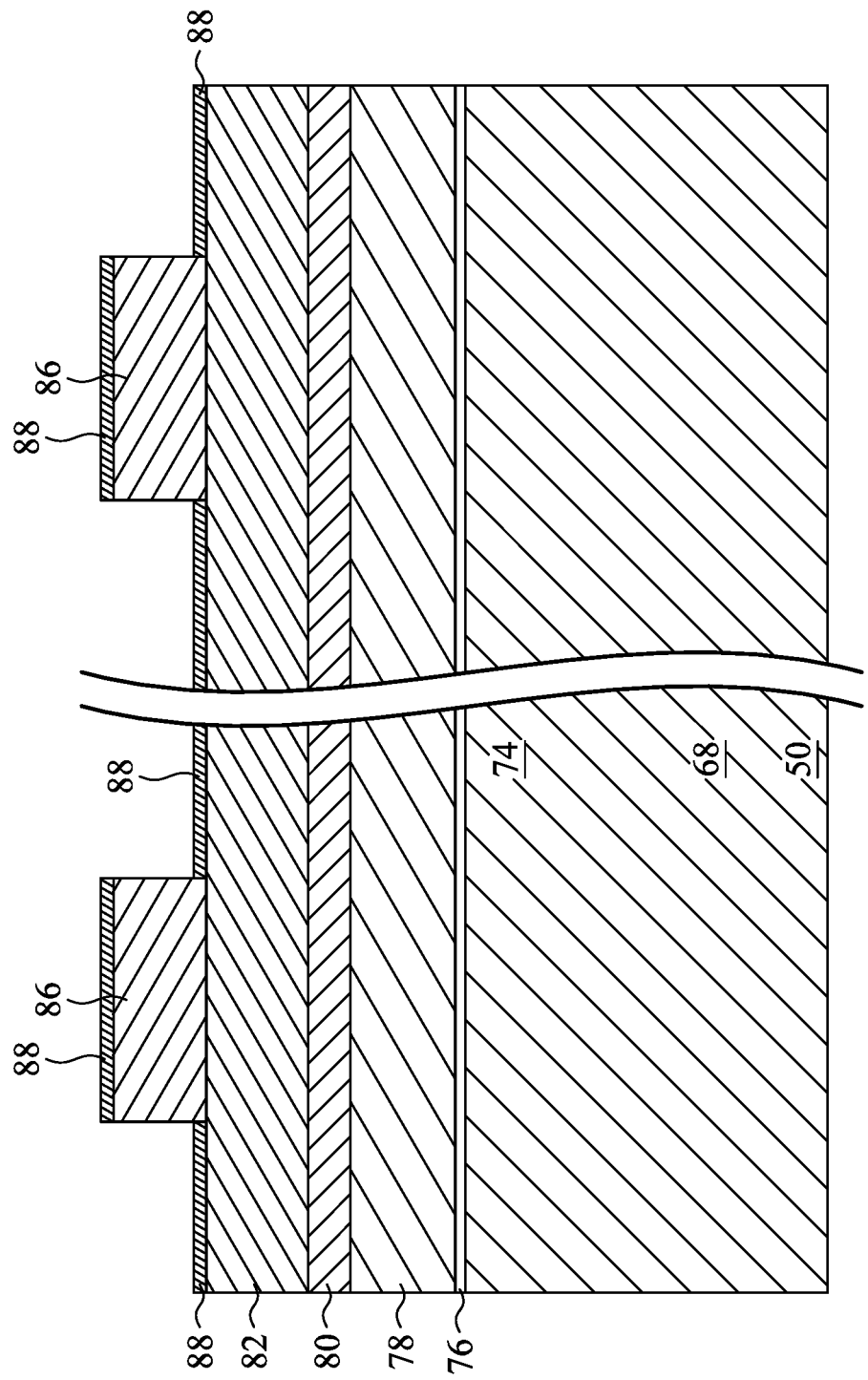

In FIG. 16, etch coating layers 88 are formed on top surfaces of the mask layer 82 and mandrels 86. The etch coating layers 88 may be formed in a manner similar to the method for forming the etch coating layers 60. The dry etching process used to form the mandrels 86 may leave polymer byproducts of the mandrels 86 and etching process gasses that form the etch coating layers 88. An optional wet cleaning process may be performed after the dry etching process to remove the etch coating layers 60 from sidewalls of the mandrels 86.

Figure 17:
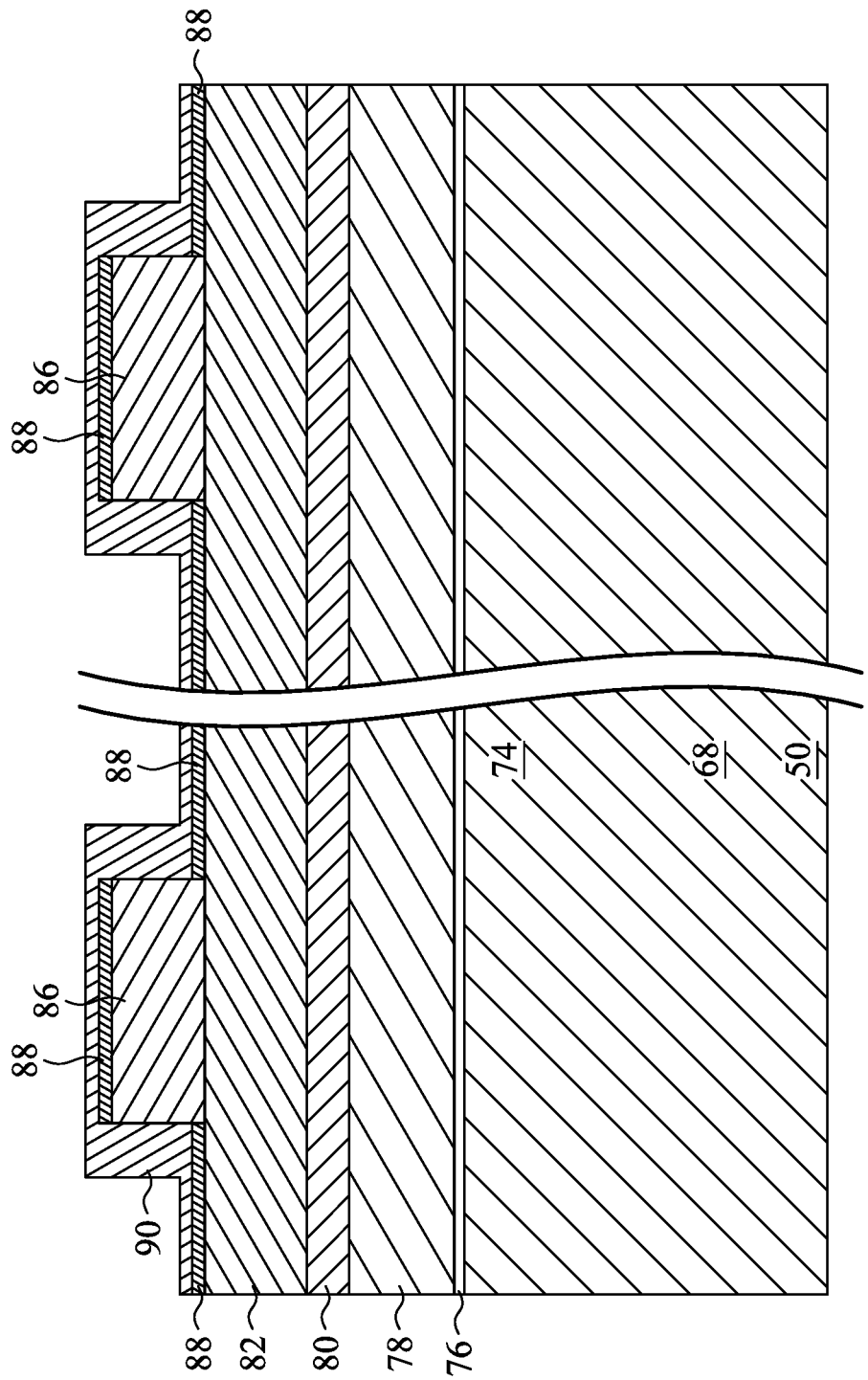

In FIG. 17, a spacer layer 90 is formed on the etch coating layers 88, e.g., over the mask layer 82 and mandrels 86. The spacer layer 90 may be formed in a manner similar to the method for forming the spacer layer 62. In an embodiment, the spacer layer 90 is formed of SiN using an ALD process. Similar to the spacer layer 62, the spacer layer 90 has vertical portions that are thicker than the horizontal portions, and has more defined corners.

Figure 18:
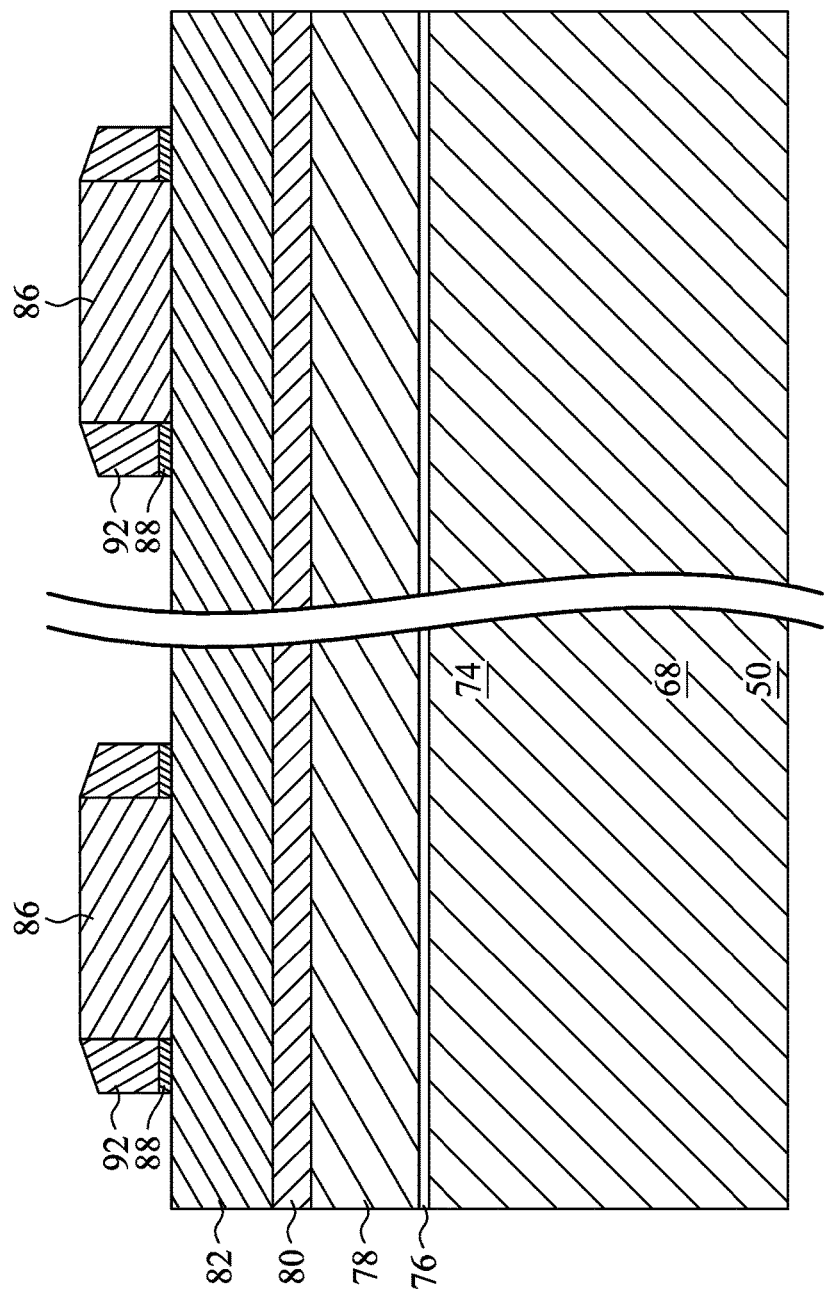

In FIG. 18, a suitable etching process is performed to remove the horizontal portions of the spacer layer 90. The horizontal portions of the spacer layer 90 may be removed in a manner similar to the method for removing the horizontal portions of the spacer layer 62. The etching process also removes portions of the etch coating layers 88 underlying the removed portions of the spacer layer 90. After the etching process, the vertical portions of the spacer layer 90 remain along the sides of the mandrels 86, and are referred to as spacers 92 hereinafter. Remaining portions of the etch coating layers 88 are under the spacers 92. Similar to the spacers 64, the spacers 92 have top surfaces with an improved slope, and may experience a top loss of from about 0% to about 5%, or of less than about 5 nm. For example, the spacers 92 may have facets with an internal angle $\theta_1$ of from about 85 degrees to about 90 degrees. As such, the spacer 92 also have more defined square corners.

Figure 19:
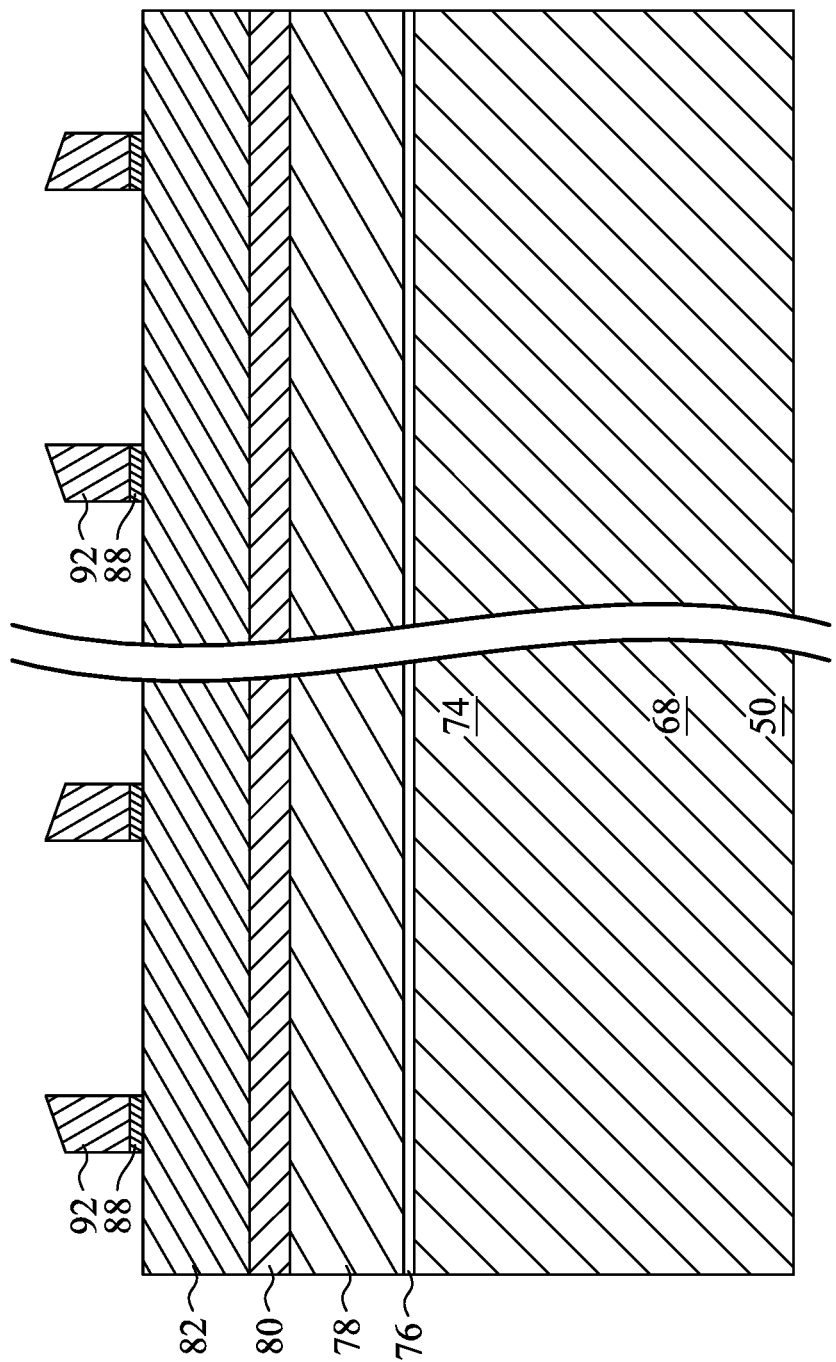

In FIG. 19, the mandrels 86 are removed. The mandrels 86 may be removed by a suitable etching processes, such as by an etch process including etchants such as $CF_4$, $CH_3F$, $H_2$, $N_2$, Ar, the like, or a combination thereof or any other suitable etchant that can remove the mandrels 86 without damaging the spacers 92. Further, a wet clean process may also be applied to substrate 50 to remove residual spacer and mandrel material. In some embodiments, the spacer etch and the mandrel removal processes are performed in a same process chamber.

Figure 20:
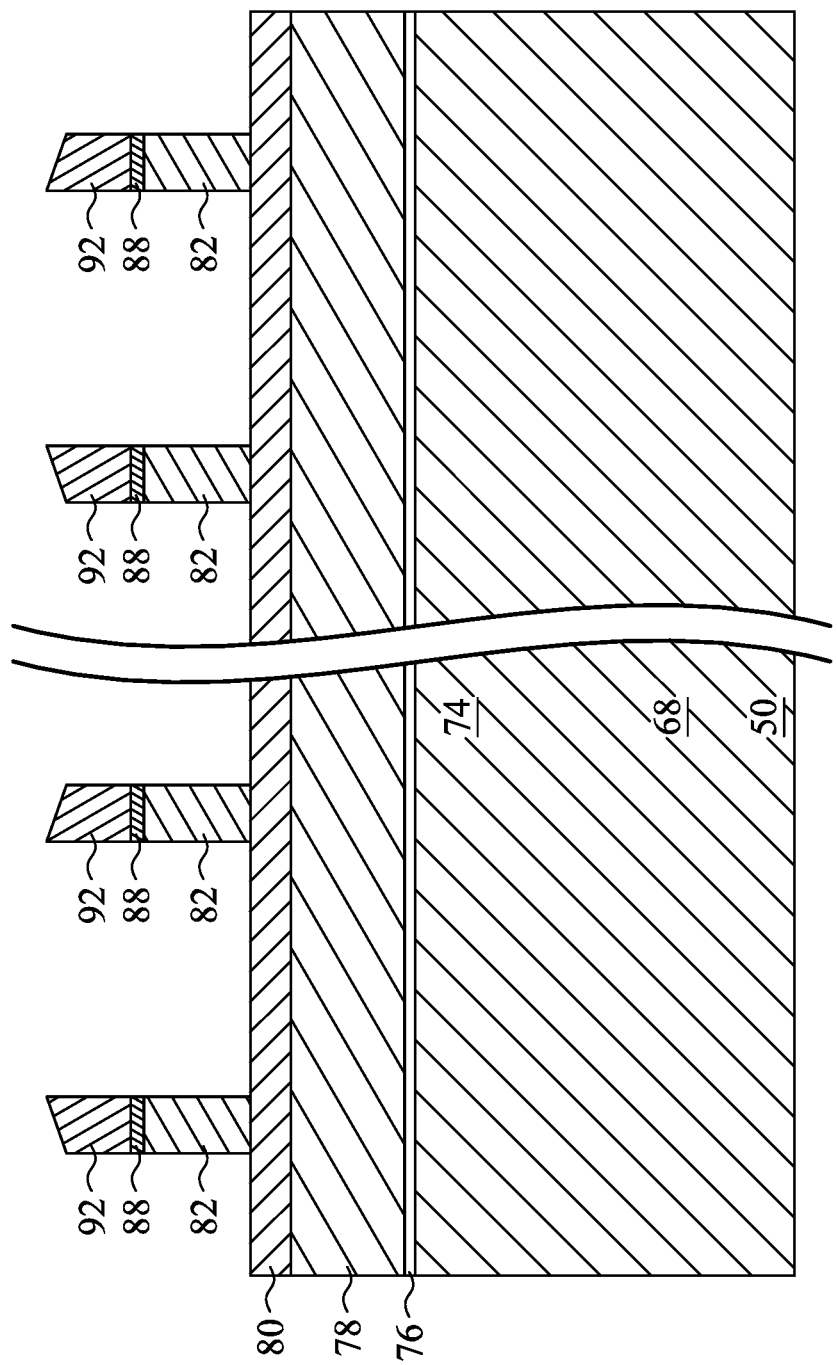

In FIG. 20, a suitable etching process is performed to pattern the mask layer 82. The spacers 92 are used as an etching mask. The pattern of the spacers 92 is therefore transferred to the mask layer 82 to form openings in the mask layer 82.

Figure 21:
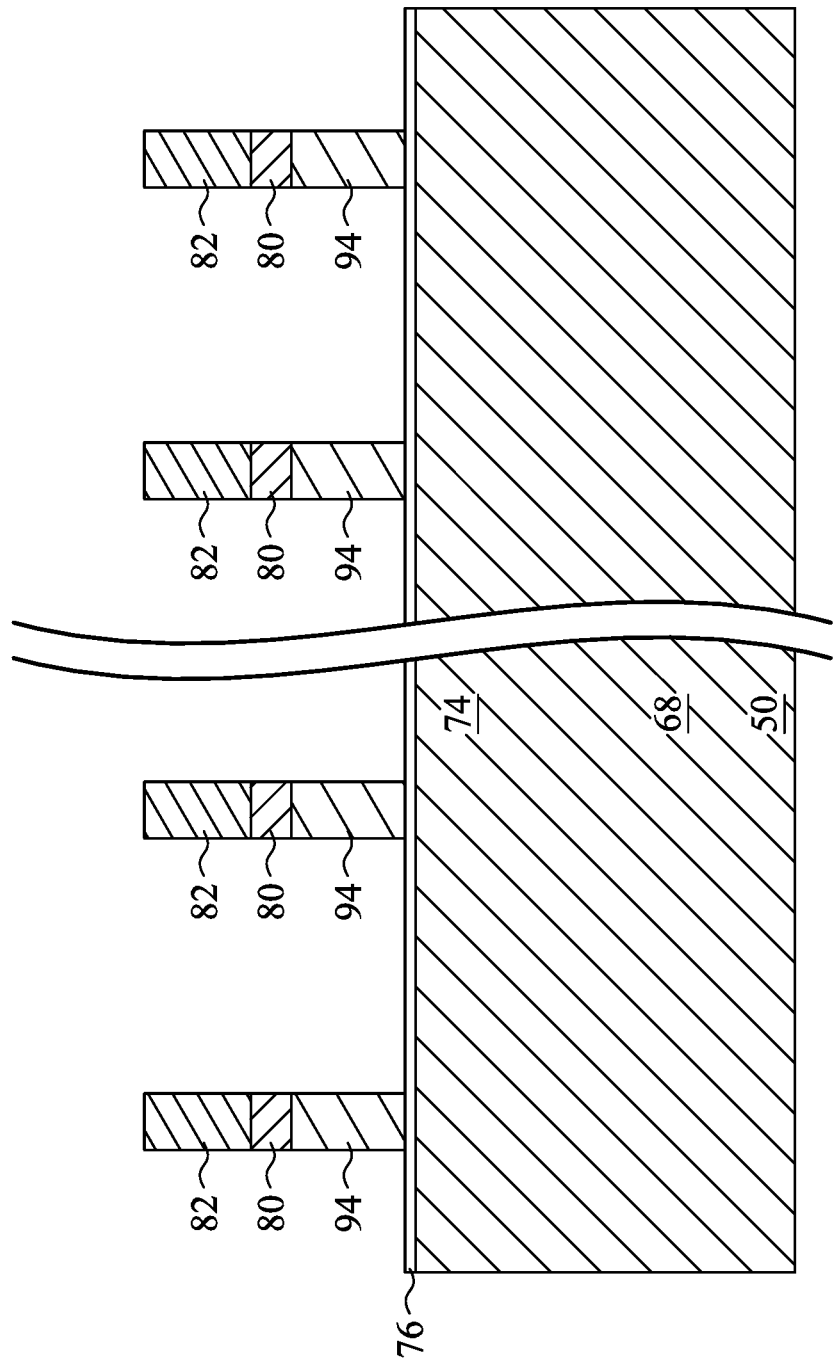

In FIG. 21, a suitable etching process is performed to etch the ARC 80 and the dummy gate layer 78 using the patterned mask layer 82 as an etching mask. The etching process may be any acceptable etch process. The etch may be anisotropic. Portions of the dummy gate layer 78 are removed, and remaining portions of the dummy gate layer 78 form dummy gates 94. The spacers 92, etch coating layers 88, patterned mask layer 82, and the patterned ARC 80 may be consumed in this process, or a cleaning process may be performed to remove residual material. The dummy gates 94 cover respective channel regions of the fins 74. The dummy gates 94 may also have a lengthwise direction substantially perpendicular to the lengthwise direction of respective fins 74.

Furthermore, although not explicitly illustrated, the patterned mask layer 82 may be used to pattern the dummy gate layer 78 and optionally the dummy dielectric layer 76 in cross section A-A of FIG. 1. Specifically, the dummy gate layer 78 may be patterned to physically separate dummy gates of adjacent finFET devices within each region 50B and 50C. For example, the dummy gates 94 may be physically separated from each other as well as dummy gates of adjacent finFET devices (not explicitly illustrated). In other embodiments, different masks (e.g., other than the patterned mask layer 82) may be used to pattern the dummy gate layer 78 in different cross sections (e.g., cross section A-A versus cross section B-B of FIG. 1). A size of the dummy gates 94, and a pitch between dummy gates 94, may depend on a region of a die in which the dummy gates 94 are formed. In some embodiments, the dummy gates 94 may have a larger size and a larger pitch when located in an input/output region of a die (e.g., where input/output circuitry is disposed) than when located in a logic region of a die (e.g., where logic circuitry is disposed).

In FIGS. 22A and 22B, gate seal spacers 100 may be formed on exposed surfaces of the dummy gates 94, the patterned mask layer 82, the ARC 80, and/or the fins 74. A thermal oxidation or a deposition followed by an anisotropic etch may form the gate seal spacers 100.

After the formation of the gate seal spacers 100, implants for lightly doped source/drain (LDD) regions 101 may be performed. In the embodiments with different device types, a mask, such as a photoresist, may be formed over the first region 50B, while exposing the second region 50C, and appropriate type (e.g., n-type or p-type) impurities may be implanted into the exposed the fins 74 in the second region 50C. The mask may then be removed. Subsequently, a mask, such as a photoresist, may be formed over the second region 50C while exposing the first region 50B, and appropriate type impurities may be implanted into the exposed fins 74 in the first region 50B. The mask may then be removed. The n-type impurities may be the any of the n-type impurities previously discussed, and the p-type impurities may be the any of the p-type impurities previously discussed. The LDD regions 101 may have a concentration of impurities of from about $10^{15}$ cm$^{-3}$ to about $10^{16}$ cm$^{-3}$. An anneal may be used to activate the implanted impurities.

Figure 23B:
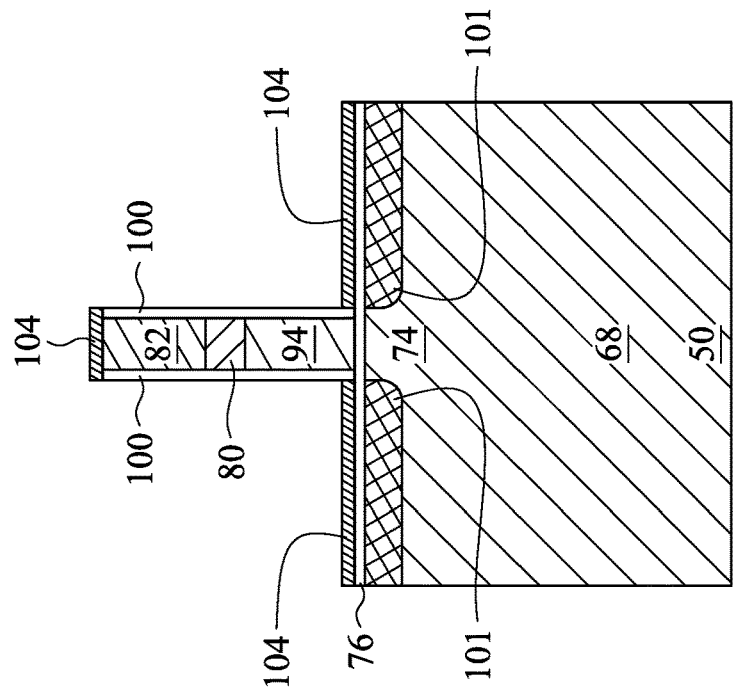
Figure 23A:
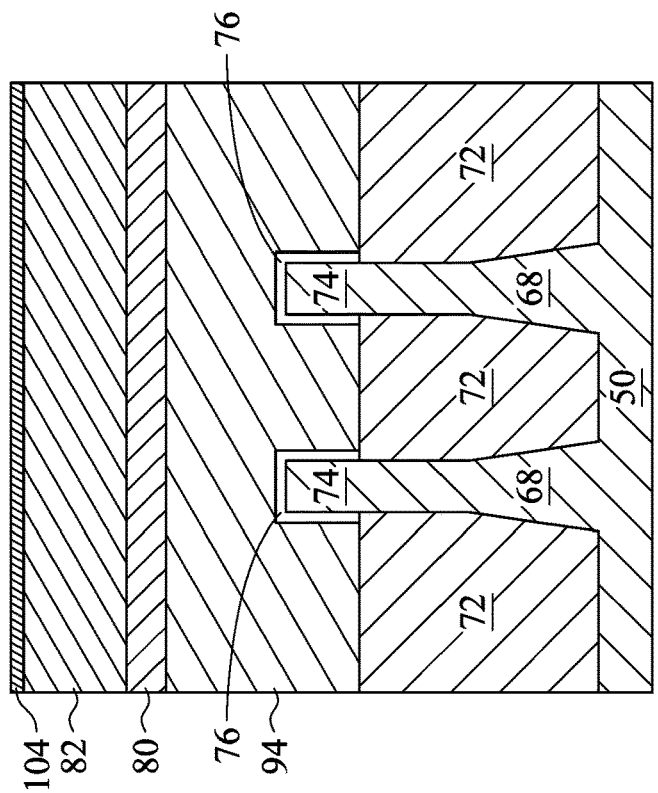

In FIGS. 23A and 23B, etch coating layers 104 are formed over the top surfaces of the patterned mask layer 82, gate seal spacers 100, and fins 74 (which may or may not include the dummy dielectric layer 76). The etch coating layers 104 may be formed in a manner similar to the method for forming the etch coating layers 60, where the etching processes used to pattern the dummy gate layer 78 into the dummy gates 94 produces the etch coating layers 104 as a byproduct.

In FIGS. 24A and 24B, a gate spacer layer 106 is formed on the etch coating layers 88, e.g., over the top surfaces of the patterned mask layer 82, gate seal spacers 100, and fins 74 (which may or may not include the dummy dielectric layer 76), and along sidewalls of the dummy gates 94 and the patterned mask layer 82. The gate spacer layer 106 may be formed in a manner similar to the method for forming the spacer layer 62, using the etch coating layers 104 to perform non-conformal deposition. In an embodiment, the gate spacer layer 106 is formed of SiN using an ALD process. Similar to the spacer layer 62, the gate spacer layer 106 has vertical portions that are thicker than the horizontal portions, and has more defined corners.

In FIGS. 25A and 25B, a suitable etching process is performed to remove the horizontal portions of the gate spacer layer 106. The horizontal portions of the gate spacer layer 106 may be removed in a manner similar to the method for removing the horizontal portions of the spacer layer 62. The etching process also removes portions of the etch coating layers 104 underlying the removed portions of the gate spacer layer 106. After the etching process, the vertical portions of the gate spacer layer 106 remain along the sides of the dummy gates 94 and the patterned mask layer 82, and are referred to as gate spacers 108 hereinafter. Remaining portions of the etch coating layers 104 are under the gate spacers 108. Similar to the spacers 64, the gate spacers 108 have top surfaces with an improved slope, and may experience a top loss of from about 0% to about 5%, or of less than about 5 nm. As such, the gate spacers 108 also have more defined square corners, and have a shape that more closely resembles a square. In particular, a width of the gate spacers 108 near a top surface of the gate spacers 108 may be about equal to a width of the gate spacers 108 near a bottom surface of the gate spacers 108.

In FIGS. 26A, 26B, 26C, and 26D, epitaxial source/drain regions 102 are formed in the fins 74 adjacent the gate spacers 108. The epitaxial source/drain regions 102 are formed in the fins 74 such that each dummy gate 94 is disposed between respective neighboring pairs of the epitaxial source/drain regions 102. The epitaxial source/drain regions 102 may extend through the LDD regions 101. The gate spacers 108 separate the epitaxial source/drain regions 102 from channel regions of the fins 74 (e.g., portions covered by the dummy gates 94), so that the epitaxial source/drain regions 102 are not shorted to the channel regions of the fins 74. In some embodiments that epitaxial source/drain regions 102 may extend into the fins 68.

The epitaxial source/drain regions 102 in the first region 50B, e.g., the NMOS region, may be formed by masking the second region 50C, e.g., the PMOS region. Then, source/drain regions of the fins 74 in the first region 50B are etched to form recesses. The epitaxial source/drain regions 102 in the first region 50B are epitaxially grown in the recesses. The epitaxial source/drain regions 102 may include any acceptable material, such as appropriate for n-type FinFETs. For example, if the fins 74 are silicon, the epitaxial source/drain regions 102 may include silicon, SiC, SiCP, SiP, or the like. Subsequently, the mask on the second region 50C is removed.

The epitaxial source/drain regions 102 in the second region 50C, e.g., the PMOS region, may be formed by masking the first region 50B, e.g., the NMOS region. Then, source/drain regions of the fins 74 in the second region 50C are etched to form recesses. The epitaxial source/drain regions 102 in the second region 50C are epitaxially grown in the recesses. The epitaxial source/drain regions 102 may include any acceptable material, such as appropriate for p-type FinFETs. For example, if the fins 74 are silicon, the epitaxial source/drain regions 102 may comprise SiGe, SiGeB, Ge, GeSn, or the like. Subsequently, the mask on the first region 50B is removed.

Figure 26B:
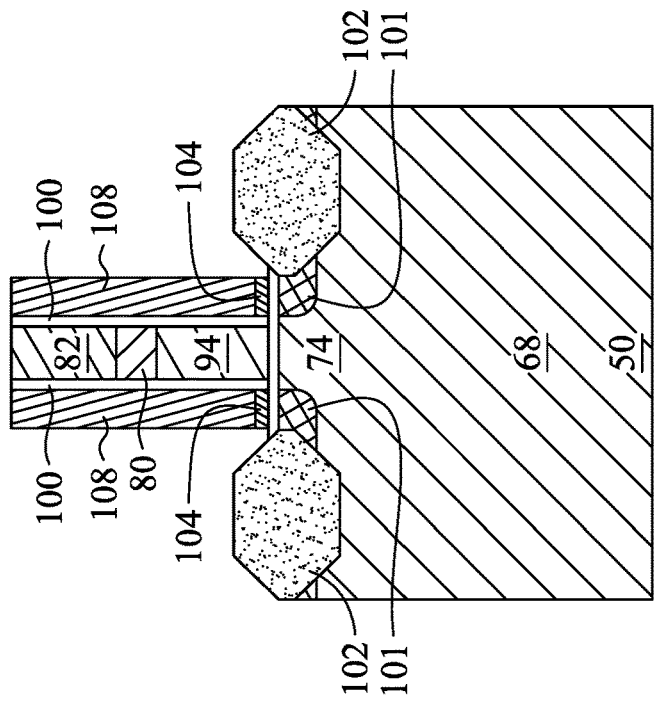
Figure 26A:
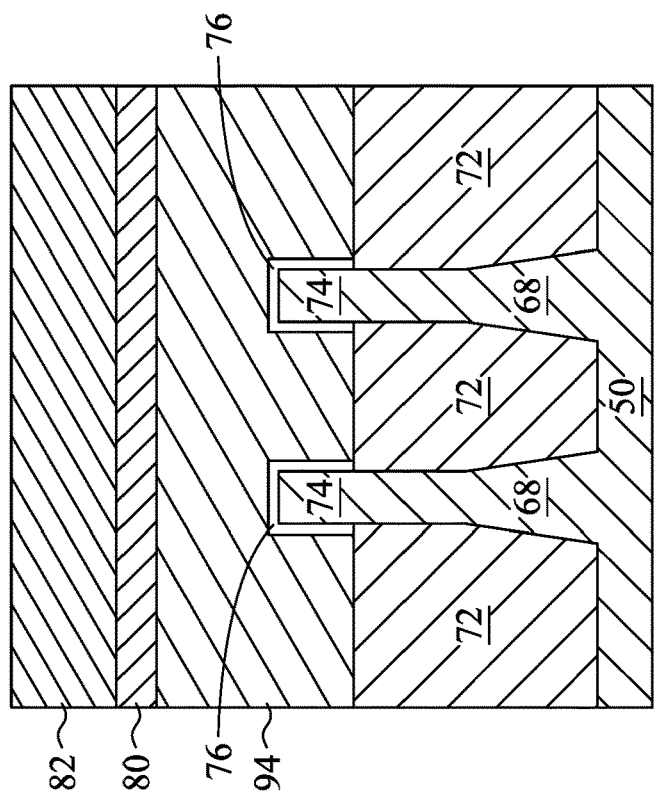
Figure 26C:
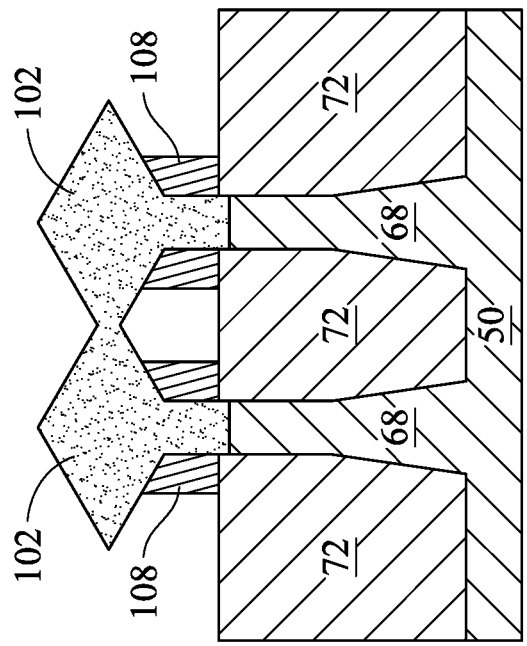
Figure 26D:
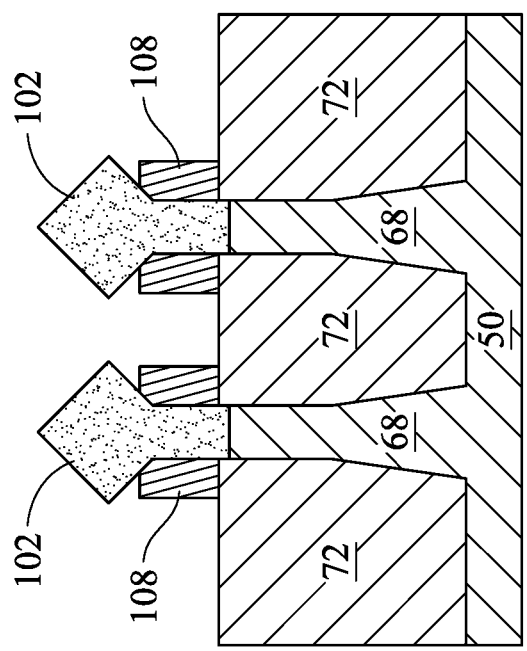

FIGS. 26C and 26D show alternative configurations of the epitaxial source/drain regions 102. As shown, the epitaxial source/drain regions 102 may have surfaces raised from respective surfaces of the fins 74 and may have facets. In the embodiment shown in FIG. 26C, the epitaxial source/drain regions 102 are separated. In the embodiment shown in FIG. 26D, the epitaxial source/drain regions 102 are merged. The epitaxial source/drain regions 102 may be separate at initial stages of epitaxial growth, and may or may not merge during epitaxial growth to form merged epitaxial source/drain regions 102. The epitaxial source/drain regions 102 may grow along portions of the gate spacers 108 adjacent the dummy gates 94.

The epitaxial source/drain regions 102 and/or the fins 74 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 102 are implanted after forming the gate spacers 109, using the gate spacers 109 as a mask for the implanting. In some embodiments, the epitaxial source/drain regions 102 are in situ doped during growth.

Figure 27B:
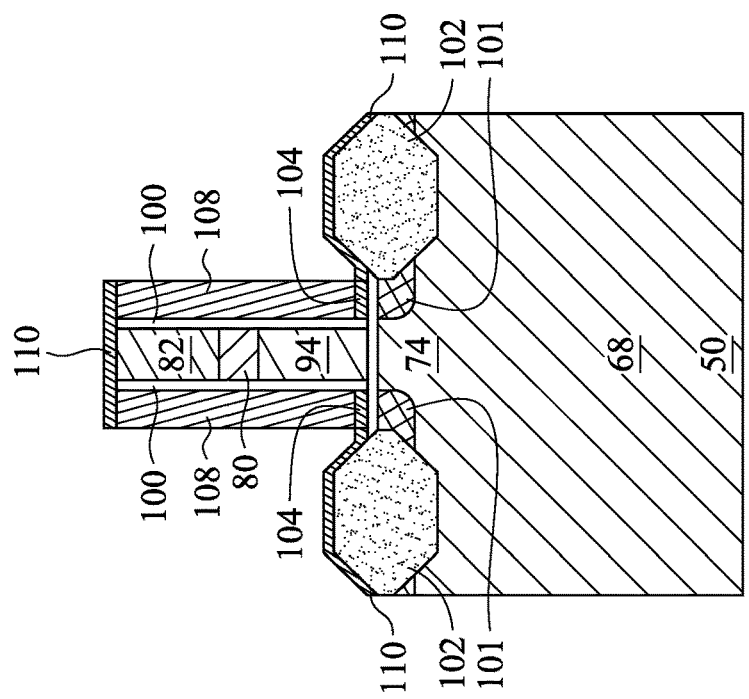
Figure 27A:
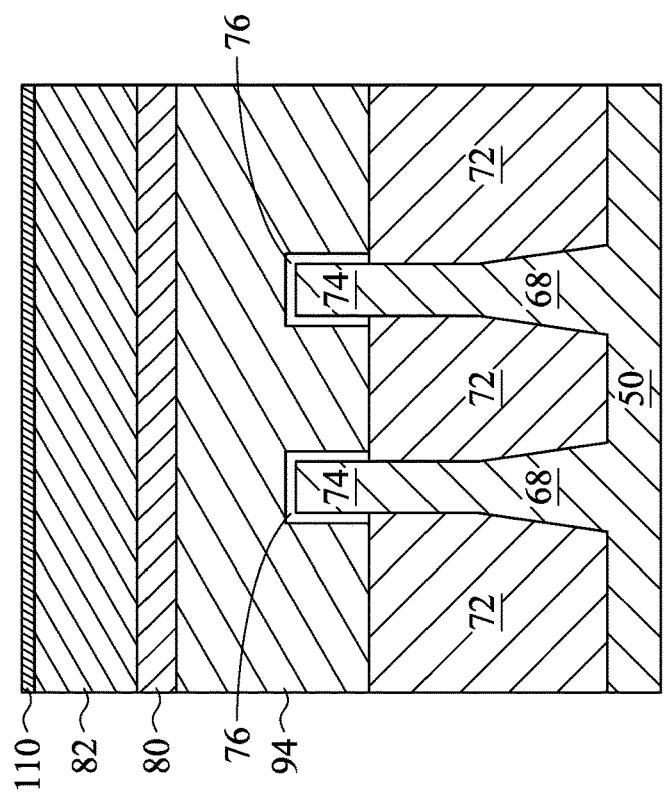

In FIGS. 27A and 27B, etch coating layers 110 are formed on the top surfaces of the patterned mask layer 82, gate seal spacers 100, epitaxial source/drain regions 102, and gate spacers 108. The etch coating layers 110 may be formed in a manner similar to the method for forming the etch coating layers 60, where the etching processes used to pattern the gate spacer layer 106 into the gate spacers 108 produces the etch coating layers 110 as a byproduct.

Figure 28B:
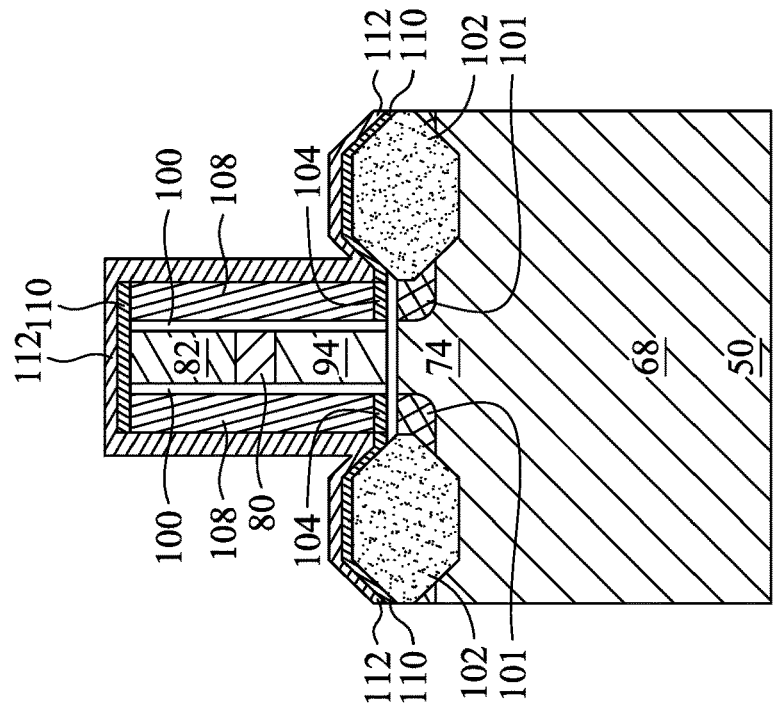
Figure 28A:
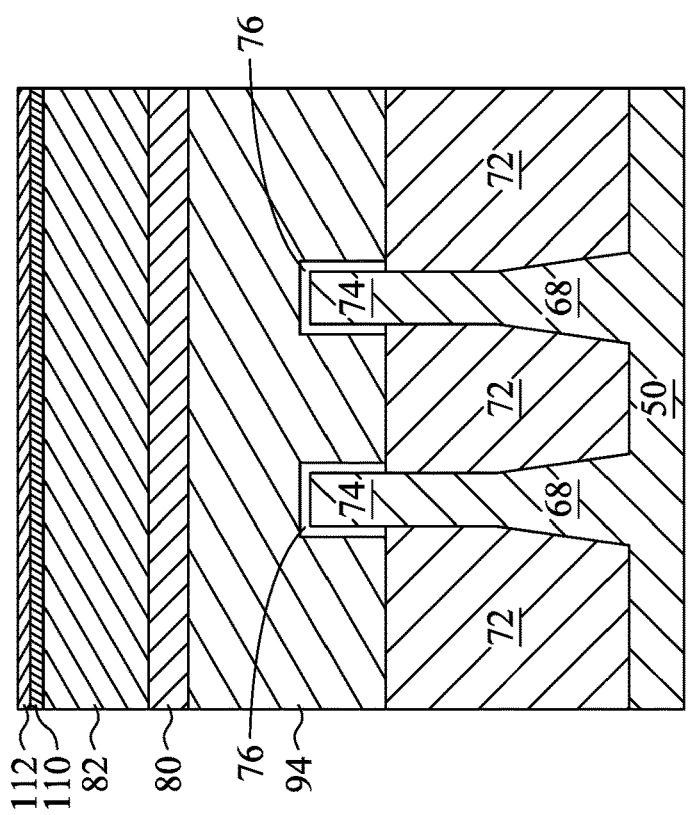

In FIGS. 28A and 28B, a CESL 112 is formed on the etch coating layers 110, e.g., over the top surfaces of the patterned mask layer 82, gate seal spacers 100, epitaxial source/drain regions 102, and gate spacers 108, and along sidewalls of the dummy gates 94 and the patterned mask layer 82. The CESL 112 may be formed in a manner similar to the method for forming the spacer layer 62, using the etch coating layers 110 to perform non-conformal deposition. In an embodiment, the CESL 112 is formed of SiN using an ALD process. Similar to the spacer layer 62, the CESL 112 has vertical portions that are thicker than the horizontal portions, and has more defined corners.

Figure 29B:
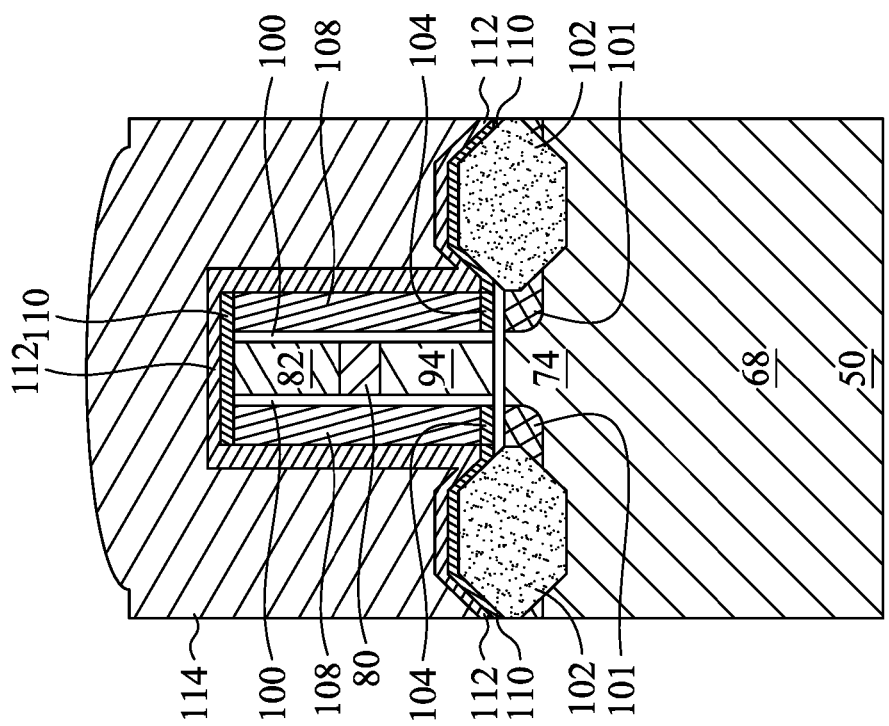
Figure 29A:
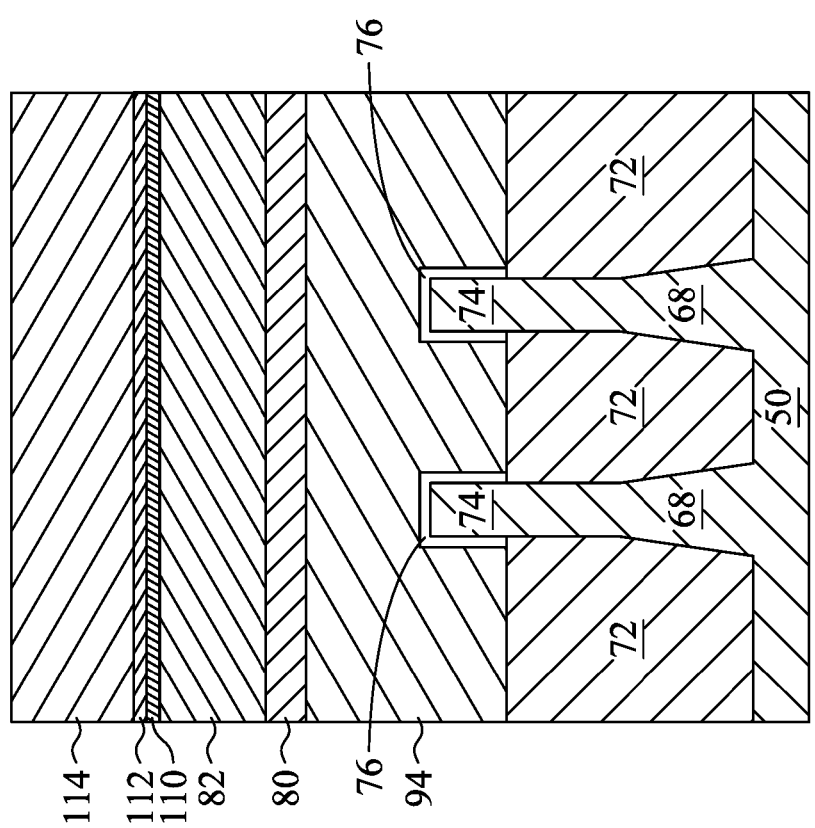

In FIGS. 29A and 29B, an ILD 114 is deposited over the structure illustrated in FIGS. 28A and 28B. The ILD 114 may be formed of a dielectric material or a semiconductor material, and may be deposited by any suitable method, such as CVD, PECVD, or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used.

In FIGS. 30A and 30B, a planarization process, such as a CMP, may be performed to level the top surface of the ILD 114 with the top surfaces of the dummy gates 94. The planarization process may also remove the etch coating layers 110, on the patterned mask layer 82, the patterned mask layer 82 on the dummy gates 94, and portions of the gate seal spacers 100, gate spacers 108, and CESL 112 along sidewalls of the patterned mask layer 82. After the planarization process, top surfaces of the dummy gates 94, gate seal spacers 100, gate spacers 108, CESL 112, and ILD 114 are level. Accordingly, the top surfaces of the dummy gates 94 are exposed through the ILD 114.

Figure 31B:
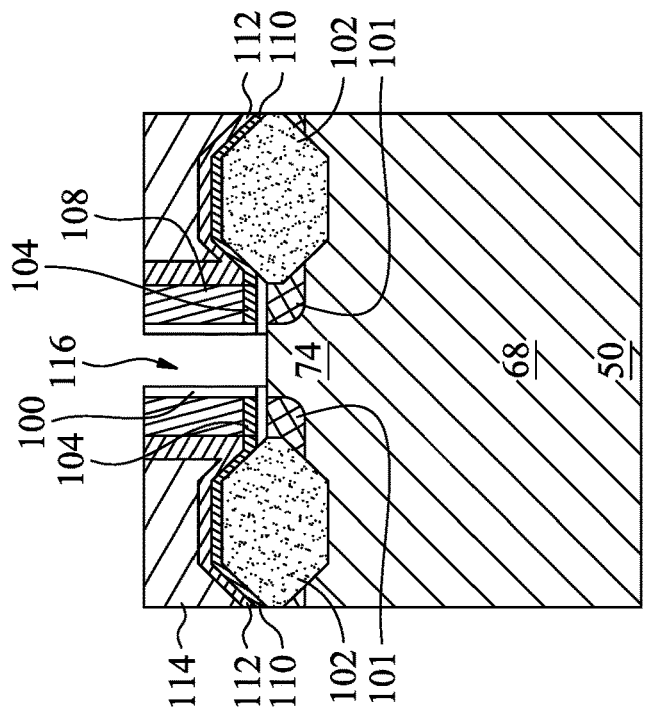
Figure 31A:
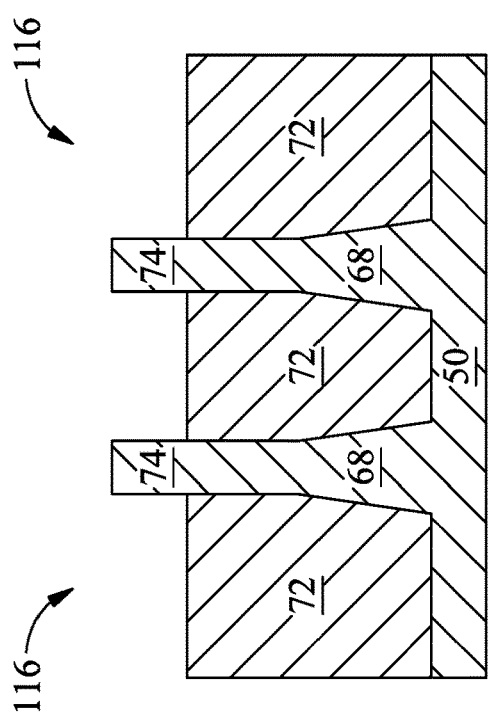

In FIGS. 31A and 31B, the exposed portions of the dummy gates 94 and portions of the dummy dielectric layer 76 directly underlying the exposed dummy gates 94 are removed in an etching step(s), so that recesses 116 are formed. In some embodiments, the dummy gates 94 are removed by an anisotropic dry etch process. For example, the etching process may include a dry etch process using reaction gas(es) that selectively etch the dummy gates 94 without etching the ILD 114 or the gate spacers 108. Each recess 116 exposes a channel region of a respective fin 74. Each channel region is disposed between neighboring pairs of the epitaxial source/drain regions 102. During the removal, the dummy dielectric layer 76 may be used as an etch stop layer when the dummy gates 94 are etched. The dummy dielectric layer 76 may then be removed after the removal of the dummy gates 94.

Figure 32B:
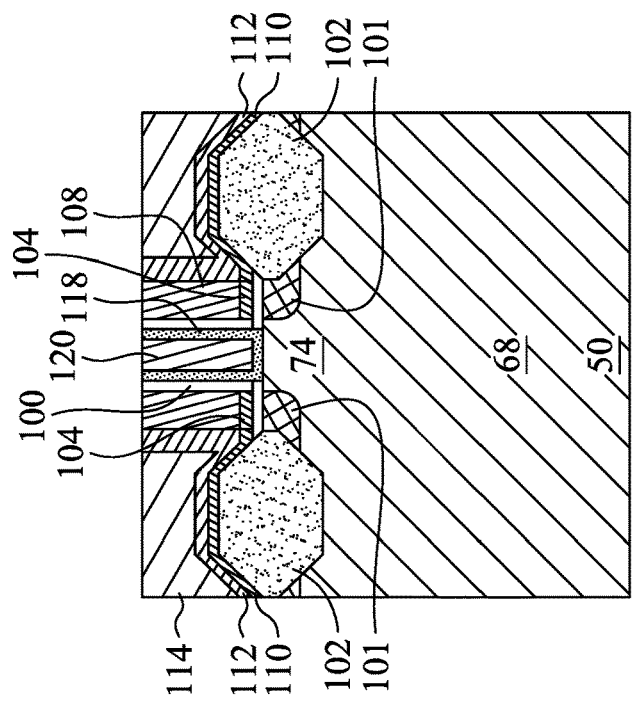
Figure 32A:
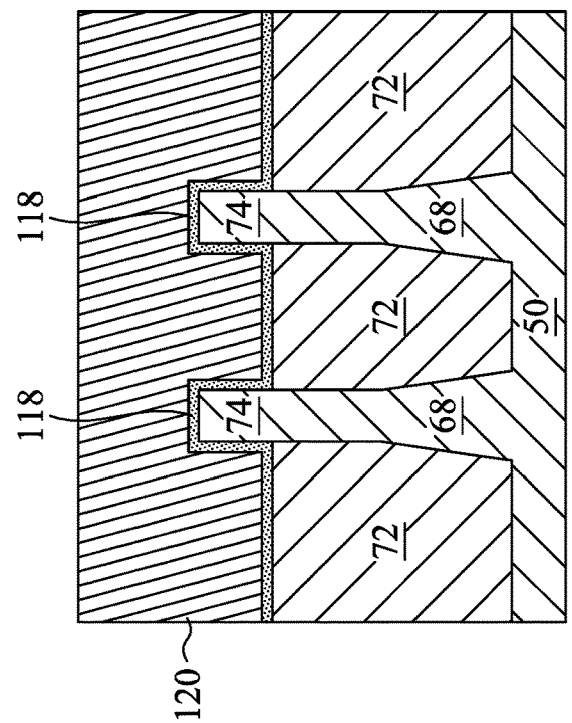

In FIGS. 32A and 32B, gate dielectric layers 118 and gate electrodes 120 are formed for replacement gates. Gate dielectric layers 118 are deposited conformally in the recesses 116, such as on the top surfaces and the sidewalls of the fins 74, on sidewalls of the gate seal spacers 110, and on a top surface of the ILD 114. According to some embodiments, the gate dielectric layers 118 are silicon oxide, silicon nitride, or multilayers thereof. In some embodiments, the gate dielectric layers 118 are a high-k dielectric material, and in these embodiments, the gate dielectric layers 118 may have a k value greater than about 7.0, and may include a metal oxide or a silicate of Hf, Al, Zr, La, Mg, Ba, Ti, Pb, and combinations thereof. The formation methods of the gate dielectric layers 118 may include Molecular-Beam Deposition (MBD), ALD, PECVD, and the like.

The gate electrodes 120 are deposited over the gate dielectric layers 118, respectively, and fill the remaining portions of the recesses 116. The gate electrodes 120 may be a metal-containing material such as TiN, TaN, TaC, Co, Ru, Al, combinations thereof, or multi-layers thereof. After the filling of the gate electrodes 120, a planarization process, such as a CMP, may be performed to remove the excess portions of the gate dielectric layers 118 and the material of the gate electrodes 120, which excess portions are over the top surface of the ILD 114. The resulting remaining portions of material of the gate electrodes 120 and the gate dielectric layers 118 thus form replacement gates of the resulting FinFETs. The gate dielectric layers 118 and gate electrodes 120 may be collectively referred to as a "gate" or a "gate stack."

The formation of the gate dielectric layers 118 in the first region 50B and the second region 50C may occur simultaneously such that the gate dielectric layers 118 in each region are formed from the same materials, and the formation of the gate electrodes 120 may occur simultaneously such that the gate electrodes 120 in each region are formed from the same materials. In some embodiments, the gate dielectric layers 118 in each region may be formed by distinct processes, such that the gate dielectric layers 118 may be different materials, and the gate electrodes 120 in each region may be formed by distinct processes, such that the gate electrodes 120 may be different materials. Various masking steps may be used to mask and expose appropriate regions when using distinct processes.

Figure 33B:
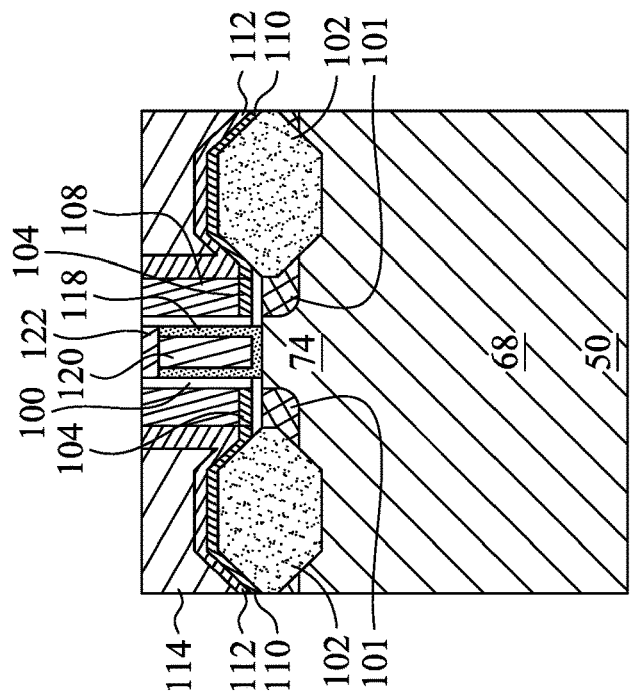
Figure 33A:
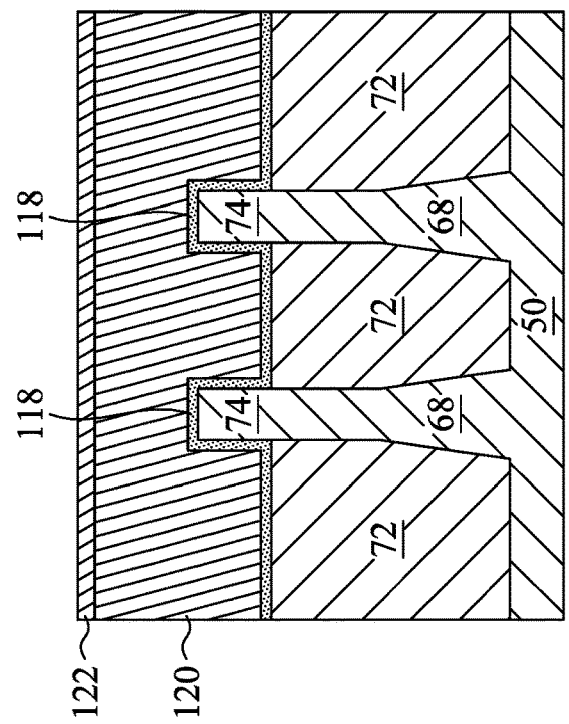

In FIGS. 33A and 33B, a hardmask 122 is formed over the gate dielectric layers 118 and the gate electrodes 120. The hardmask 122 provides protection for the gate spacers 108 during subsequent self-aligned contact etching steps to ensure that the self-aligned contacts do not short the gate electrodes 120 to the corresponding epitaxial source/drain regions 102. The hardmask 122 may be formed by recessing the gate dielectric layers 118 and gate electrodes 120 in an etching step(s). The etching step(s) may include an anisotropic dry etch. For example, the etching step(s) may include a dry etch process using reaction gas(es) that selectively etch the gate dielectric layers 118 and the gate electrodes 120 without etching the gate spacers 108, CESL 112, and ILD 114. The hardmask 122 may be formed in the recesses and on top surfaces of the gate spacers 108, CESL 112, and ILD 114. A planarization process, such as a CMP, may then be performed to level the top surface of the hardmask 122 with the top surfaces of the ILD 114, CESL 112, and gate spacers 108. The hardmask 122 may include one or more oxide (e.g., silicon oxide) and/or nitride (e.g., silicon nitride) layers, and may be formed by CVD, PVD, ALD, plasma-enhanced atomic layer deposition (PEALD), a spin-on-dielectric process, the like, or a combination thereof. In an embodiment, the hardmask 122 is SiN, and is deposited with an ALD process.

Figure 34B:
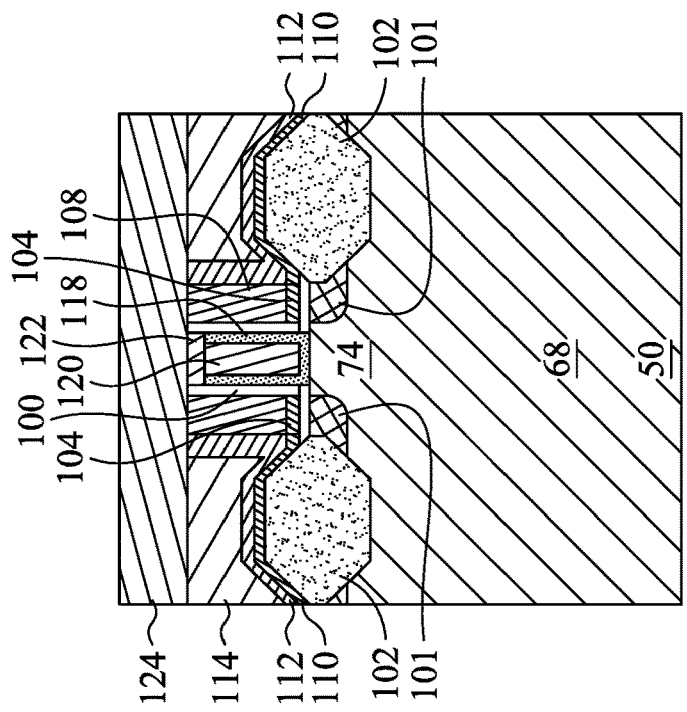
Figure 34A:
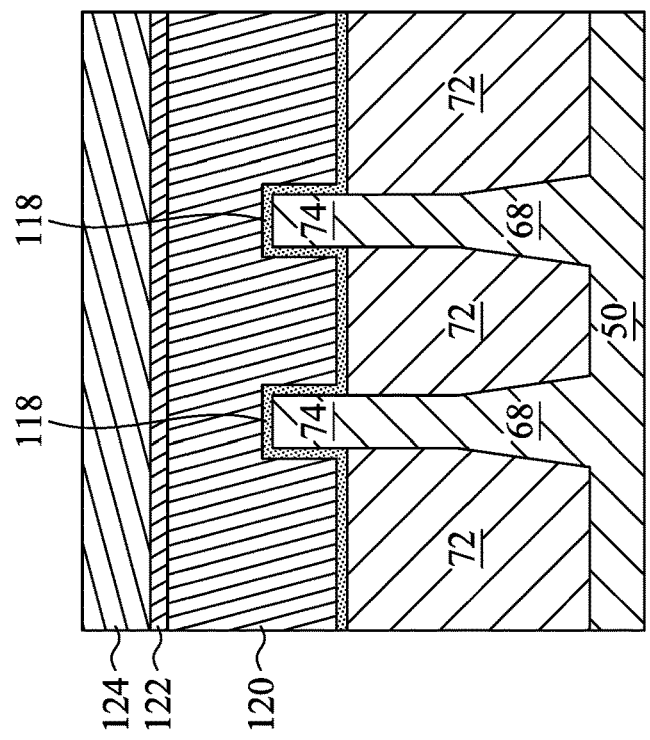

In FIGS. 34A and 34B, an ILD 124 is deposited over the ILD 114 and hardmask 122. In an embodiment, the ILD 124 is a flowable film formed by a flowable CVD method. In some embodiments, the ILD 124 is formed of a dielectric material such as PSG, BSG, BPSG, USG, or the like, and may be deposited by any suitable method, such as CVD and PECVD.

Figure 35A:
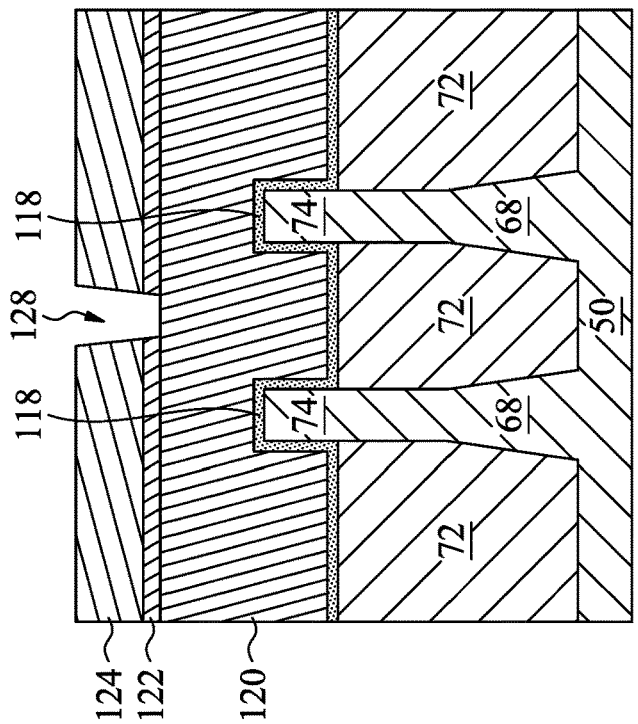
Figure 35B:
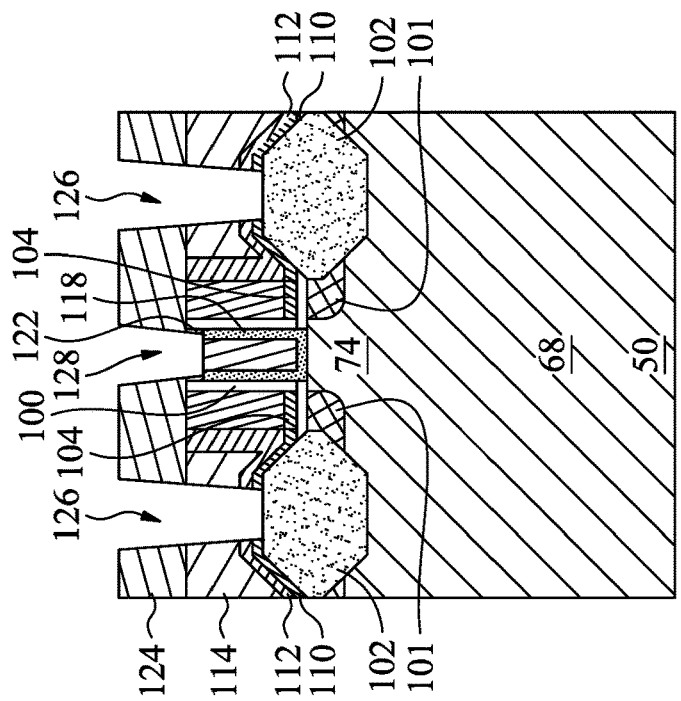

In FIGS. 35A and 35B, openings 126 and 128 for contacts are formed through the ILD 114, the ILD 124, the CESL 112, the etch coating layers 110, and the hardmask 122. The openings 126 and 128 may be formed simultaneously in a same process, or in separate processes. In an embodiment, the openings 126 are formed before the openings 128 using acceptable photolithography and etching techniques. The more defined square shape of the gate spacers 108 and CESL 112 helps protect the epitaxial source/drain regions 102 during the etching of the openings 126, reducing the probability that the epitaxial source/drain regions 102 short to the gate electrodes 120. The hardmask 122 also helps protect the gate electrodes 120. The openings 128 may then be formed using acceptable photolithography and etching techniques. The more defined square shape of the gate spacers 108 may increase the probability of the openings 128 fully exposing the gate electrodes 120 without shorting the epitaxial source/drain regions 102.

Figure 36B:
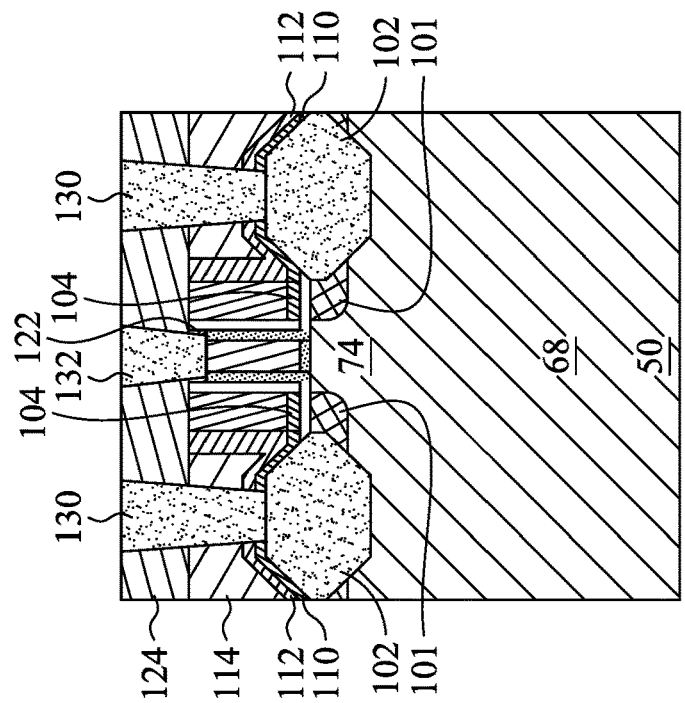
Figure 36A:
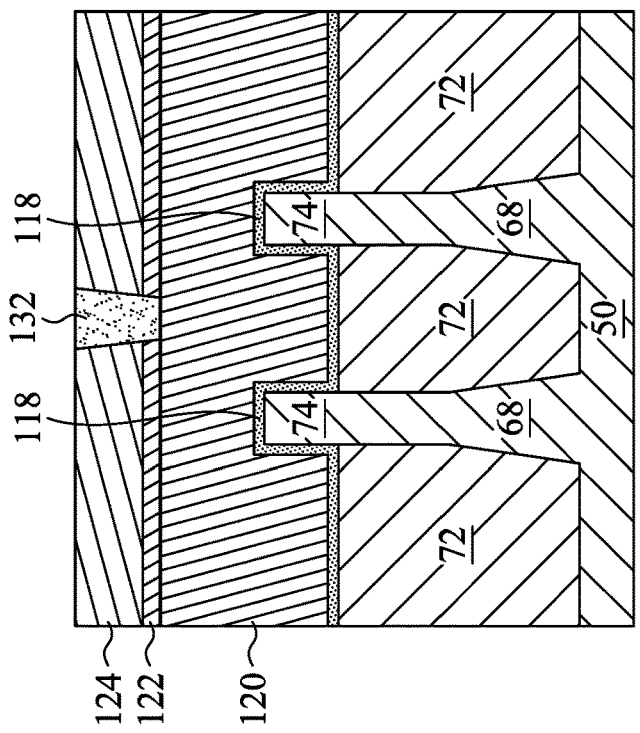

In FIGS. 36A and 36B, contacts 130 and 132 are formed in the openings 126 and 128. A liner, such as a diffusion barrier layer, an adhesion layer, or the like is formed in the openings 126 and 128. The liner may include titanium, titanium nitride, tantalum, tantalum nitride, or the like. A conductive material is formed in the openings 126 and 128 over the liner. The conductive material may be copper, a copper alloy, silver, gold, tungsten, aluminum, nickel, cobalt, or the like. A planarization process, such as a CMP, may be performed to remove excess material from a surface of the ILD 124. The remaining liner and conductive material form the contacts 130 and 132 in the openings. An anneal process may be performed to form a silicide at the interface between the epitaxial source/drain regions 102 and the contacts 130. The contacts 130 are physically and electrically connected to the epitaxial source/drain regions 102, and the contacts 132 are physically and electrically connected to the gate electrodes 120. Although the contacts 132 (e.g., gate contacts) are shown as being in the same cross-section as the contacts 130 (e.g., source/drain contacts), it should be appreciated they may be disposed in different cross-sections. Forming the contacts in different cross-sections may help avoid shorting of the contacts 130 and the contacts 132.

Embodiments may achieve advantages. Non-conformal SiN layers may be formed with an ALD process at several intermediate steps of manufacturing FinFETs. For example, such layers may be used to manufacture the fins themselves, the dummy gates, the gate spacers, and the CESL. Forming etching masks with more defined corners may enlarge or improve the etching window, thereby improving the resulting shapes of the fins and dummy gates. Forming gate spacers and a CESL with more defined corners may better protect source/drain regions and result in a larger contact etching window, thereby reducing the chances of electrical shorts or gate contact failures when forming the contacts. Loss of the epitaxial material of the source/drain regions may also be reduced.

In an embodiment, a method includes: patterning a plurality of mandrels over a mask layer; forming an etch coating layer on top surfaces of the mask layer and the mandrels; depositing a dielectric layer over the mask layer and the mandrels, a first thickness of the dielectric layer along sidewalls of the mandrels being greater than a second thickness of the dielectric layer along the etch coating layer; removing horizontal portions of the dielectric layer; and patterning the mask layer using remaining vertical portions of the dielectric layer as an etching mask.

In some embodiments, the depositing the dielectric layer over the mask layer and the mandrels includes depositing SiN over the mask layer and the mandrels. In some embodiments, the depositing the SiN includes depositing the SiN with an atomic layer deposition (ALD) process, the etch coating layer inhibiting the ALD process on the top surfaces of the mask layer and the mandrels. In some embodiments, the method further includes: patterning a target layer using the patterned mask layer as an etching mask. In some embodiments, the mask layer is formed over a substrate, and the patterning the target layer includes patterning trenches in the substrate. In some embodiments, the mask layer is formed over a dummy gate layer, and the patterning the target layer includes patterning the dummy gate layer to form dummy gates over a plurality of fins.

In an embodiment, a method includes: forming a mandrel layer over a mask layer; etching the mandrel layer in a dry etching process to form a plurality of mandrels, a byproduct of the dry etching process remaining on sidewalls of the mandrels and on top surfaces of the mandrels and the mask layer after the dry etching process; removing the byproduct of the dry etching process on the sidewalls of the mandrels; depositing a SiN layer on sidewalls of the mandrels and on the byproduct of the dry etching process remaining on the top surfaces of the mandrels and the mask layer; and etching the SiN layer until horizontal portions of the SiN layer are removed, remaining vertical portions of the SiN layer forming spacers.

In some embodiments, the SiN layer has a first deposition rate on the sidewalls of the mandrels, and a second deposition rate on the byproduct of the dry etching process remaining on the top surfaces of the mandrels and the mask layer, where the first deposition rate is greater than the second deposition rate. In some embodiments, the byproduct of the dry etching process includes one of $SiBrO_x$, $SiClO_x$, $SiO_x$, or $CH_xF_y$. In some embodiments, the dry etching process includes exposing the mandrel layer to a plasma source and one or more etchant gases. In some embodiments, the mandrel layer is formed of Si, and the plasma source is one of a halide plasma or an $O_2$ plasma. In some embodiments, the mandrel layer is formed of $CH_x$, and the plasma source is fluorine. In some embodiments, the etchant gases include $SF_6$ and $CF_4$, mixed, respectively, at a ratio of 1:20. In some embodiments, the dry etching process is performed at an etching bias voltage of from 50 volts to 800 volts, and the dry etching process is performed with a duty cycle of from 3 cycles/minute to 99 cycles/minute. In some embodiments, the removing the byproduct of the dry etching process on the sidewalls of the mandrels includes: cleaning the mandrels and the mask layer in a wet cleaning process, the wet cleaning process removing the byproduct of the dry etching process on the sidewalls of the mandrels. In some embodiments, the vertical portions of the SiN layer have a first height before etching the SiN layer, and a second height after etching the SiN layer, where the second height is from 0% to about 5% less than the first height.

In an embodiment, a method includes: forming a gate stack over a fin; forming etch coating layers over the gate stack and the fin, sidewalls of the gate stack substantially free from the etch coating layers; depositing a dielectric material over the fin, the dielectric material formed to have a first thickness over the gate stack and a second thickness along the sidewalls of the gate stack, the second thickness greater than the first thickness; and removing a top portion of the dielectric material.

In some embodiments, the method further includes: forming epitaxial source/drain regions in the fin adjacent the gate stack, where remaining portions of the dielectric material form an etch stop layer over the epitaxial source/drain regions. In some embodiments, the method further includes: removing a bottom portion of the dielectric material, where remaining portions of the dielectric material form gate spacers adjacent the gate stack. In some embodiments, corners of the gate spacers have an internal angle of from about 85 degrees to about 90 degrees.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    patterning a plurality of mandrels over a mask layer;
    forming an etch coating layer on top surfaces of the mask layer and the mandrels;
    depositing a dielectric layer over the mask layer and the mandrels with a deposition process, a first deposition rate of the deposition process along sidewalls of the mandrels being greater than a second deposition rate of the deposition process along the etch coating layer, a first thickness of the dielectric layer along the sidewalls of the mandrels being greater than a second thickness of the dielectric layer along the etch coating layer;
    removing horizontal portions of the dielectric layer; and
    patterning the mask layer using remaining vertical portions of the dielectric layer as a first etching mask.

2. The method of claim 1, wherein the depositing the dielectric layer over the mask layer and the mandrels comprises depositing SiN over the mask layer and the mandrels.

3. The method of claim 2, wherein the deposition process is an atomic layer deposition (ALD) process, the etch coating layer inhibiting the ALD process on the top surfaces of the mask layer and the mandrels.

4. The method of claim 1, further comprising:
    patterning a target layer using the patterned mask layer as a second etching mask.

5. The method of claim 4, wherein the mask layer is formed over a substrate, and wherein the patterning the target layer comprises patterning trenches in the substrate.

6. The method of claim 4, wherein the mask layer is formed over a dummy gate layer, and wherein the patterning the target layer comprises patterning the dummy gate layer to form dummy gates over a plurality of fins.

7. A method comprising:
    forming a mandrel layer over a mask layer;
    etching the mandrel layer in a dry etching process to form a plurality of mandrels, a byproduct of the dry etching process remaining on sidewalls of the mandrels and on top surfaces of the mandrels and the mask layer after the dry etching process;
    removing the byproduct of the dry etching process on the sidewalls of the mandrels;
    depositing a SiN layer on sidewalls of the mandrels and on the byproduct of the dry etching process remaining on the top surfaces of the mandrels and the mask layer; and
    etching the SiN layer until horizontal portions of the SiN layer are removed, remaining vertical portions of the SiN layer forming spacers.

8. The method of claim 7, wherein the SiN layer has a first deposition rate on the sidewalls of the mandrels, and a second deposition rate on the byproduct of the dry etching process remaining on the top surfaces of the mandrels and the mask layer, wherein the first deposition rate is greater than the second deposition rate.

9. The method of claim 7, wherein the byproduct of the dry etching process comprises one of $SiBrO_x$, $SiClO$, $SiO_x$, or $CH_xF_y$.

10. The method of claim 7, wherein the dry etching process comprises exposing the mandrel layer to a plasma source and one or more etchant gases.

11. The method of claim 10, wherein the mandrel layer is formed of Si, and the plasma source is one of a halide plasma or an $O_2$ plasma.

12. The method of claim 10, wherein the mandrel layer is formed of $CH_x$, and the plasma source is fluorine.

13. The method of claim 10, wherein the etchant gases include $SF_6$ and $CF_4$, mixed, respectively, at a ratio of 1:20.

14. The method of claim 7, wherein the dry etching process is performed at an etching bias voltage of from 50 volts to 800 volts, and the dry etching process is performed with a duty cycle of from 3 cycles/minute to 99 cycles/minute.

15. The method of claim 7, wherein the removing the byproduct of the dry etching process on the sidewalls of the mandrels comprises:
cleaning the mandrels and the mask layer in a wet cleaning process, the wet cleaning process removing the byproduct of the dry etching process on the sidewalls of the mandrels.

16. The method of claim 7, wherein the vertical portions of the SiN layer have a first height before etching the SiN layer, and a second height after etching the SiN layer, wherein the second height is from 0% to about 5% less than the first height.

17. A method comprising:
forming a gate stack over a fin;
forming an etch coating layer along tops of the gate stack and the fin, sidewalls of the gate stack being substantially free from the etch coating layer;
depositing a dielectric material over the fin with a deposition process, the etch coating layer reducing a deposition rate of the deposition process along the tops of the gate stack and the fin, the dielectric material being deposited to have a first thickness over the gate stack and a second thickness along the sidewalls of the gate stack, the second thickness being greater than the first thickness; and
removing a top portion of the dielectric material.

18. The method of claim 17, further comprising:
forming epitaxial source/drain regions in the fin adjacent the gate stack, remaining portions of the dielectric material forming an etch stop layer over the epitaxial source/drain regions.

19. The method of claim 17, further comprising:
removing a bottom portion of the dielectric material, remaining portions of the dielectric material forming gate spacers adjacent the gate stack.

20. The method of claim 19, wherein corners of the gate spacers have an internal angle of from about 85 degrees to about 90 degrees.

* * * * *